US012603120B2

(12) United States Patent
Visconti

(10) Patent No.: US 12,603,120 B2
(45) Date of Patent: *Apr. 14, 2026

(54) SWITCH AND HOLD BIASING FOR MEMORY CELL IMPRINT RECOVERY

(71) Applicant: Micron Technology, Inc., Boise, ID (US)

(72) Inventor: Angelo Visconti, Appiano Gentile (IT)

(73) Assignee: Micron Technology, Inc., Boise, ID (US)

( * ) Notice: Subject to any disclaimer, the term of this patent is extended or adjusted under 35 U.S.C. 154(b) by 197 days.

This patent is subject to a terminal disclaimer.

(21) Appl. No.: 18/521,872

(22) Filed: Nov. 28, 2023

(65) Prior Publication Data

US 2024/0096390 A1 Mar. 21, 2024

Related U.S. Application Data

(63) Continuation of application No. 17/830,100, filed on Jun. 1, 2022, now Pat. No. 11,862,221.

(51) Int. Cl.
*G11C 11/22* (2006.01)

(52) U.S. Cl.
CPC ........ *G11C 11/2297* (2013.01); *G11C 11/221* (2013.01)

(58) Field of Classification Search
CPC ........................... G11C 11/2297; G11C 11/221

USPC .......................................................... 365/145
See application file for complete search history.

(56) References Cited

U.S. PATENT DOCUMENTS

| | | | |
|---|---|---|---|
| 11,049,541 B2 * | 6/2021 | Müller ................. | G11C 11/223 |
| 11,631,473 B2 | 4/2023 | Bangalore et al. | |
| 11,862,221 B2 * | 1/2024 | Visconti ................ | G11C 29/50 |
| 12,019,506 B2 * | 6/2024 | Basuta ................ | G06F 11/0793 |
| 2017/0365323 A1 * | 12/2017 | Calderoni ........... | G11C 11/2273 |
| 2021/0089385 A1 | 3/2021 | Basuta et al. | |
| 2021/0090680 A1 | 3/2021 | Bangalore et al. | |

* cited by examiner

*Primary Examiner* — Connie C Yoha
(74) *Attorney, Agent, or Firm* — Holland & Hart LLP

(57) ABSTRACT

Methods, systems, and devices for switch and hold biasing for memory cell imprint recovery are described. A memory device may be configured to perform an imprint recovery procedure that includes applying one or more recovery pulses to memory cells, where each recovery pulse is associated with a voltage polarity and includes a first portion with a first voltage magnitude and a second portion with a second voltage magnitude that is lower than the first voltage magnitude. In some examples, the first voltage magnitude may correspond to a voltage that imposes a saturation polarization on a memory cell (e.g., on a ferroelectric capacitor, a polarization corresponding to the associated voltage polarity) and the second voltage magnitude may correspond to a voltage magnitude that is high enough to maintain the saturation polarization (e.g., to prevent a reduction of polarization) of the memory cell.

20 Claims, 10 Drawing Sheets

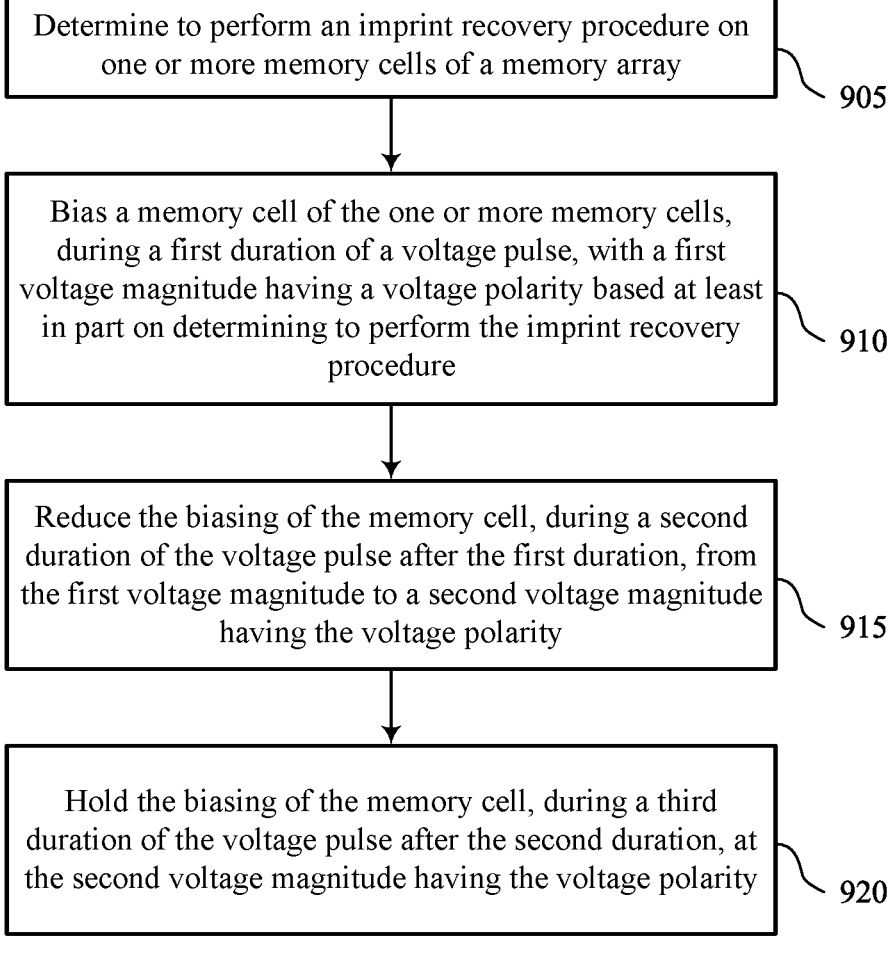

Determine to perform an imprint recovery procedure on one or more memory cells of a memory array

905

Bias a memory cell of the one or more memory cells, during a first duration of a voltage pulse, with a first voltage magnitude having a voltage polarity based at least in part on determining to perform the imprint recovery procedure

910

Reduce the biasing of the memory cell, during a second duration of the voltage pulse after the first duration, from the first voltage magnitude to a second voltage magnitude having the voltage polarity

915

Hold the biasing of the memory cell, during a third duration of the voltage pulse after the second duration, at the second voltage magnitude having the voltage polarity

Determine a condition indicative of imprinted memory cells of a memory device

1005

Transmit a command to perform an imprint recovery procedure based at least in part on determining the condition indicative of imprinted memory cells

1010

1000

SWITCH AND HOLD BIASING FOR MEMORY CELL IMPRINT RECOVERY

CROSS REFERENCE

The present Application for Patent is a continuation of U.S. patent application Ser. No. 17/830,100 by Visconti, entitled "SWITCH AND HOLD BIASING FOR MEMORY CELL IMPRINT RECOVERY," filed Jun. 1, 2022, assigned to the assignee hereof, and is expressly incorporated by reference in its entirety herein.

FIELD OF TECHNOLOGY

The following relates to one or more systems for memory, including switch and hold biasing for memory cell imprint recovery.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory but may have non-volatile properties due to the use of a ferroelectric capacitor as a storage device.

BRIEF DESCRIPTION OF THE DRAWINGS

FIGS. 9 and 10 show flowcharts illustrating methods that support switch and hold biasing for memory cell imprint recovery in accordance with examples as disclosed herein.

DETAILED DESCRIPTION

Figure 1:
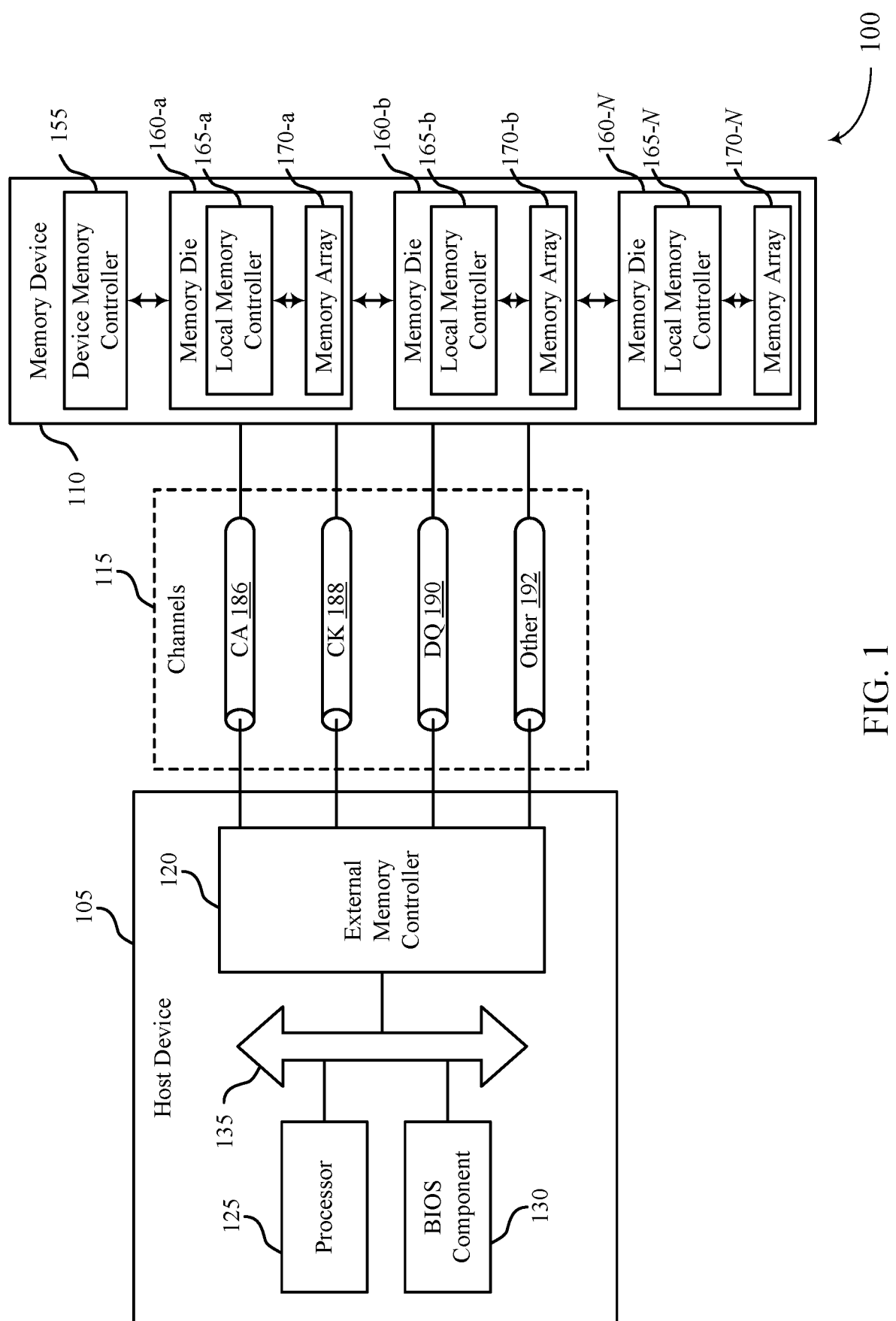
FIG. 1 illustrates an example of a system that supports switch and hold biasing for memory cell imprint recovery in accordance with examples as disclosed herein.

Memory devices may experience various conditions when operating as part of electronic devices such as mobile devices, personal computers, wireless communication devices, servers, internet-of-things (IoT) devices, vehicles or vehicle components, etc. In some cases, one or more memory cells of a memory device may become imprinted, which may refer to various conditions where a memory cell of a memory device becomes predisposed toward storing one logic state over another, resistant to being written to a different logic state (e.g., a logic state different than a stored logic state prior to a write operation), or both. A likelihood of a memory cell becoming imprinted with a logic state may be related to a duration of storing a logic state, or a temperature of the memory cell while storing a logic state, or both, among other factors or combinations of factors.

In some examples, a memory device may experience imprinting from being exposed to an elevated temperature over a duration, such as being located in a hot vehicle, located in direct sunlight, or other environments, where such conditions may be referred to as a static bake (e.g., when one or more memory cells are maintained at a particular logic state during the elevated temperature exposure). In some cases, a static bake may imprint (e.g., thermally imprint) memory cells such that they become biased toward or stuck in a first state (e.g., a physical state corresponding to a first logic state) over another state (e.g., a physical state corresponding to a second logic state). In some examples, memory cells may store logic states, or may be in physical states (e.g., a charge state, a material state) that may be associated with data or may not be associated with data, in an as-manufactured condition. The memory cells may experience some amount of imprinting prior to the memory device being installed in a system or operated in the system, such as an imprinting over time while idle or unpowered in a warehouse, which may cause degraded performance or failures upon initial (or later) operation. In some examples, imprinting may be inadvertently or maliciously caused by operating parameters or access patterns, among other techniques.

Imprinted memory cells may be associated with adverse performance when compared with non-imprinted memory cells. For example, imprinted memory cells may resist charge flow during access operations (e.g., during a read operation, during a write operation), may resist changes in polarization during access operations, may resist changes in material properties such as changes in atomic distribution or arrangement, changes in electrical resistance, or changes in threshold voltage, or may be associated with other behaviors that are different than non-imprinted memory cells (e.g., behaviors that are asymmetric with respect to different logic states). For example, when a write operation is performed on an imprinted memory cell in an effort to write a target logic state, the memory cell may not store the target logic state, or a memory device may be otherwise unable to be read the memory cell as storing the target state (e.g., despite a write operation being performed), which may result in access errors (e.g., write errors, read errors) or data corruption, among other issues. Although some imprinted memory cells may be recovered (e.g., unimprinted, unstuck, repaired, normalized, equalized) by applying recovery pulses (e.g., voltage pulses, current pulses) to the memory cells, some techniques for imprint recovery may be associated with relatively high power consumption, or relatively high peak current that can affect the memory cells or other components or both, among other adverse characteristics.

In accordance with examples as disclosed herein, a memory device may be configured to perform an imprint recovery procedure that includes applying one or more recovery pulses (e.g., voltage pulses) to memory cells, where each recovery pulse is associated with a voltage polarity and includes a first portion (e.g., a first duration) with a first voltage magnitude and a second portion (e.g., a second duration, following the first duration) with a second voltage magnitude that is lower than the first voltage magnitude. In some examples (e.g., for an FeRAM architecture), the first voltage magnitude may correspond to a voltage that imposes a polarization on a memory cell (e.g., on a ferroelectric capacitor, a polarization corresponding to the associated voltage polarity, a saturation polarization) and the second voltage magnitude may correspond to a voltage magnitude that is high enough to maintain the polarization (e.g., to prevent a reduction of polarization) of the memory cell. Maintaining the polarization of the memory cell for a duration of the recovery pulse may support the memory cell returning to a non-imprinted (e.g., normalized, equalized, symmetric) state and, by reducing the recovery pulse to the second voltage magnitude, power consumption is reduced compared to maintaining the recovery pulse at the first voltage magnitude, among other benefits. In some examples, such recovery techniques may include staggering (e.g., offsetting) the durations of recovery pulses applied to different memory cells to reduce peak power consumption (e.g., peak current draw) as compared with examples in which such durations are aligned or otherwise overlapping, among other benefits.

Features of the disclosure are initially described in the context of systems, dies, and memory cell properties with reference to FIGS. 1 through 4. Features of the disclosure are further described in the context of switch and hold biasing techniques with reference to FIGS. 5 and 6. These and other features of the disclosure are further illustrated by and described with reference to an apparatus diagram and flow-charts that relate to switch and hold biasing for memory cell imprint recovery as described with reference to FIGS. 7 through 10.

FIG. 1 illustrates an example of a system 100 that supports switch and hold biasing for memory cell imprint recovery in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes (where such "other circuitry" is hereinafter also referred to in the specification and claims as a "processor"), such as within a computing device, a mobile computing device, a wireless device, a graphics processing device, a computer, a laptop computer, a tablet computer, a smart-phone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute com-mands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other com-ponents such as one or more peripheral components or one or more input/output controllers. The components of the host device 105 may be coupled with one another using a bus 135.

The processor 125 may be operable to provide function-ality (e.g., control functionality) for the system 100 or the host device 105. The processor 125 may be a general-purpose processor, a digital signal processor (DSP), an application-specific integrated circuit (ASIC), a field-pro-grammable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other nonvolatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, one or more memory cells of a memory array 170 may become imprinted, which may refer to various conditions where a memory cell becomes predisposed toward storing one logic state over another, resistant to being written to a different logic state (e.g., a logic state different than a logic state stored prior to a write operation), or both. A likelihood of a memory cell becoming imprinted with a logic state may be related to a duration of storing a logic state (e.g., a continuous duration, an uninterrupted duration), a temperature of the memory cell while storing a logic state, inadvertent or malicious access patterns, or other factors. Although some imprinted memory cells may be recovered (e.g., unimprinted, unstuck, repaired, normalized, equalized) by applying recovery pulses (e.g., voltage pulses, current pulses) to the memory cells, some techniques for imprint recovery may be associated with relatively high power consumption.

In accordance with examples as disclosed herein, a memory device 110 (e.g., a device memory controller 155, a local memory controller 165) may be configured to perform an imprint recovery procedure that includes applying one or more recovery pulses (e.g., voltage pulses) to memory cells, where each recovery pulse is associated with a voltage polarity and includes a first portion (e.g., a first duration) with a first voltage magnitude and a second portion (e.g., a second duration, following the first duration) with a second voltage magnitude that is lower than the first voltage magnitude. In some examples (e.g., for an FeRAM configuration), the first voltage magnitude may correspond to a voltage that imposes a saturation polarization on a memory cell (e.g., on a ferroelectric capacitor, a polarization corresponding to the associated voltage polarity) and the second voltage magnitude may correspond to a voltage magnitude that is high enough to maintain the saturation polarization (e.g., to prevent a reduction of polarization) of the memory cell. Maintaining the saturation polarization of the memory cell for a duration of the recovery pulse may support the memory cell returning to a non-imprinted (e.g., equalized, symmetric) state and, by reducing the recovery pulse to the second voltage magnitude, power consumption (e.g., of the memory device 110, of the system 100) is reduced compared to maintaining the recovery pulse at the first voltage magnitude. In some examples, such recovery techniques may include staggering (e.g., offsetting) the first durations of recovery pulses applied to different memory cells to reduce peak power consumption (e.g., peak current draw by the memory device 110) as compared with examples in which such first durations are aligned or otherwise overlapping.

Figure 2:
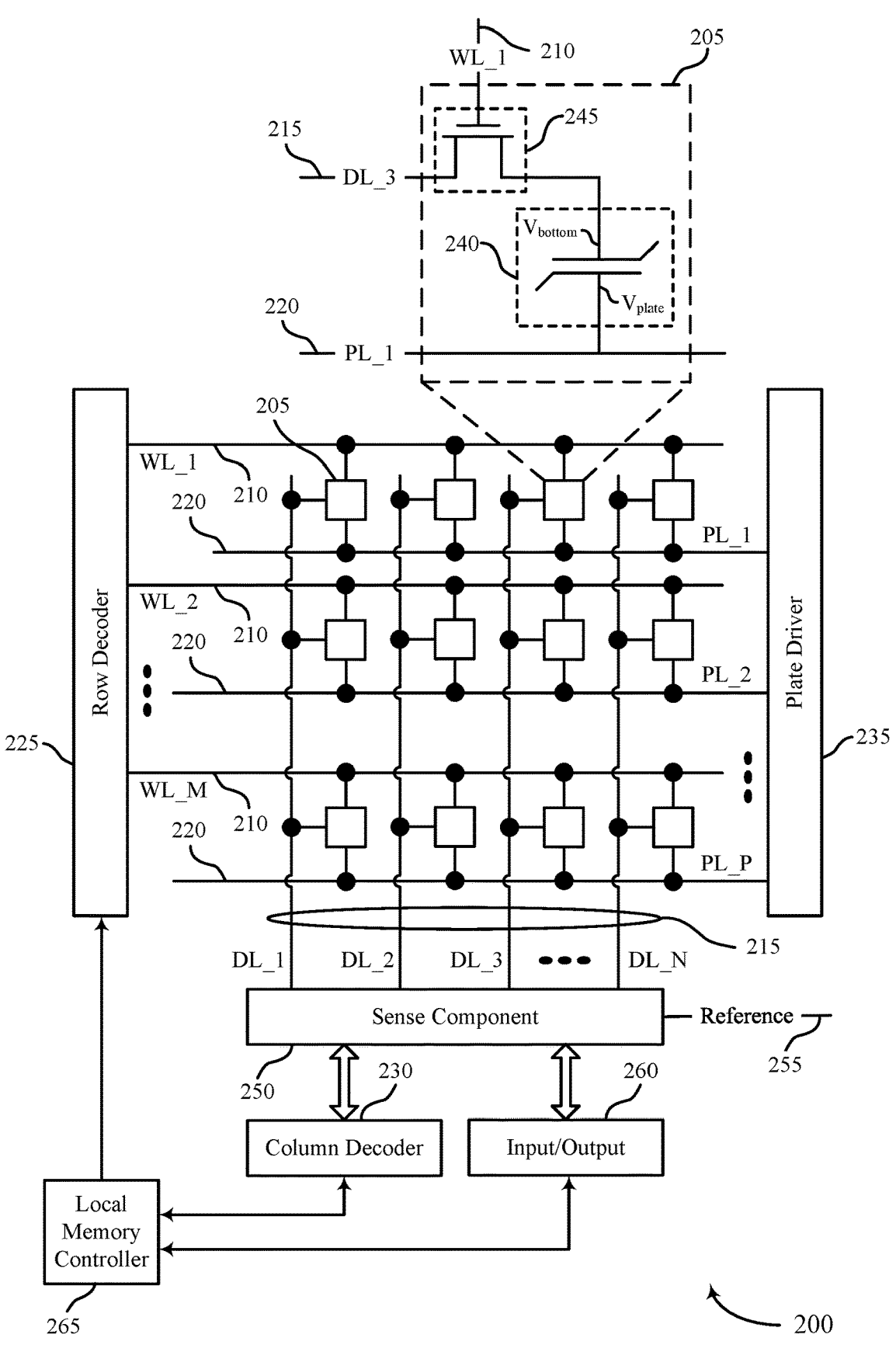
FIG. 2 illustrates an example of a memory die that supports switch and hold biasing for memory cell imprint recovery in accordance with examples as disclosed herein.

FIG. 2 illustrates an example of a memory die 200 that supports switch and hold biasing for memory cell imprint recovery in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., a polarization state, a dielectric charge) representative of the programmable states in a capacitor. The memory cell 205 may include a logic storage component, such as capacitor 240, and a switching component 245 (e.g., a cell selection component). A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. In FeRAM architectures, the memory cell 205 may include a capacitor 240 (e.g., a ferroelectric capacitor) that includes a ferroelectric material to store a charge (e.g., a polarization) representative of the programmable state.

In some other examples, a memory cell 205 may store a logic state using a configurable material, which may be referred to as a memory element, a memory storage element, a material element, a material memory element, a material portion, a polarity-written material portion, and others. A configurable material of a memory cell 205 may have one or more variable and configurable characteristics or properties (e.g., material states) that are representative of (e.g., correspond to) different logic states. For example, a configurable material may take different forms, different atomic configurations, different degrees of crystallinity, different atomic distributions, or otherwise maintain different characteristics. In some examples, such characteristics may be associated with different electrical resistances, different threshold voltages, or other properties that are detectable or distinguishable during a read operation to identify a logic state stored by the configurable material. In some examples, a configurable material may refer to a chalcogenide-based storage component. For example, a chalcogenide storage element may be used in phase change memory (PCM) cells or self-selecting memory cells. Chalcogenide storage elements may be examples of resistive memories or thresholding memories.

The memory die 200 may include access lines (e.g., word lines 210, digit lines 215, and plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or a combination thereof. For example, a row decoder 225 may receive a row address from the local memory controller 265 and activate a word line 210 based on the received row address. A column decoder 230 may receive a column address from the local memory controller 265 and activate a digit line 215 based on the received column address. A plate driver 235 may receive a plate address from the local memory controller 265 and activate a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state, a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage, a reference line). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

In some cases, environmental conditions (e.g., a static bake) may shift or change a programable characteristic of a memory cell 205. For example, in an FeRAM application, a static bake may shift or alter the polarization capacity, coercivity, or other aspect of charge mobility of the memory cell 205, which may cause the memory cell 205 to become biased toward a specific logic state (e.g., biased toward being written to or read as a logic 1 state, biased toward being written to or read as a logic 0 state). In a memory application using a configurable material (e.g., material memory elements), these or other conditions may cause a variable and configurable characteristic or property to resist being changed in response to write operations, such as a resistance to being programmed with a different atomic configuration, a resistance to being programmed with a different degree of crystallinity, a resistance to being programmed with a different atomic distribution, or a resistance to being programmed with some other characteristic associated with a different logic state. Such changes in a programmable characteristic may be referred to as an imprinting, and may cause read or write behavior that is different than when imprinting has not occurred (e.g., asymmetric behavior with respect to logic states). For example, when a write operation, intended to change a logic state of a memory cell, is performed on an imprinted memory cell 205 having an initial state, the memory cell 205 may remain or return to the initial (e.g., imprinted) state, or may be otherwise read as storing the initial state. For example, if a memory cell 205 is imprinted in the 0 logic state, the memory cell 205 may continue to remain in the 0 logic state, or continue to be read as storing the logic 0 state, after an attempt to write the memory cell 205 with a logic 1 state (e.g., after performing a write operation corresponding to the logic 1 state).

In accordance with examples as disclosed herein, components of a memory die 200 (e.g., a local memory controller 265, a row decoder 225, a column decoder 230, a plate driver 235) may be configured to perform an imprint recovery procedure that includes applying one or more recovery pulses (e.g., voltage pulses) to memory cells 205, where each recovery pulse is associated with a voltage polarity and includes a first portion (e.g., a first duration) with a first voltage magnitude and a second portion (e.g., a second duration, following the first duration) with a second voltage magnitude that is lower than the first voltage magnitude. In some examples (e.g., for an FeRAM configuration), the first voltage magnitude may correspond to a voltage that imposes a saturation polarization on a memory cell 205 (e.g., on a ferroelectric capacitor 240, a polarization corresponding to the associated voltage polarity) and the second voltage magnitude may correspond to a voltage magnitude that is high enough to maintain the saturation polarization (e.g., to prevent a reduction of polarization) of the memory cell 205. Maintaining the saturation polarization of the memory cell 205 for a duration of the recovery pulse may support the memory cell 205 returning to a non-imprinted (e.g., equalized, symmetric) state and, by reducing the recovery pulse to the second voltage magnitude, power consumption (e.g., of the memory die 200) is reduced compared to maintaining the recovery pulse at the first voltage magnitude. In some examples, such recovery techniques may include staggering (e.g., offsetting) the first durations of recovery pulses applied to different memory cells 205 (e.g., to different rows of memory cells 205, to different columns of memory cells 205, to different sections of memory cells 205) to reduce peak power consumption (e.g., peak current draw by the memory die 200) as compared with examples in which such first durations are aligned or otherwise overlapping.

Figure 3A:
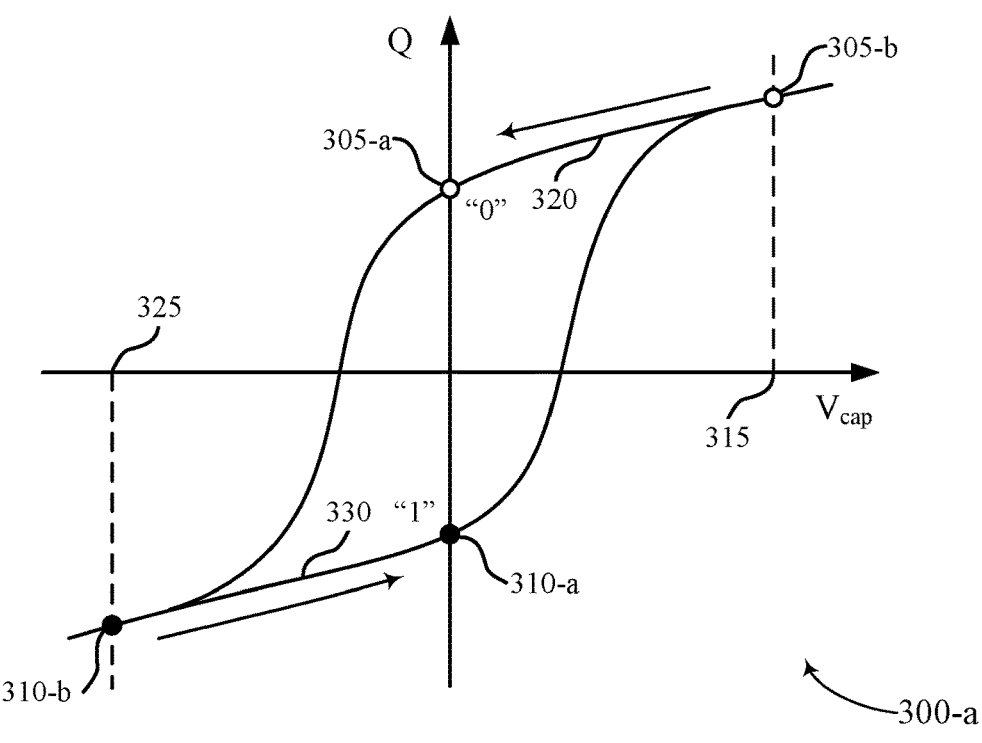
FIGS. 3A and 3B illustrate examples of non-linear electrical properties of a ferroelectric memory cell with hysteresis plots in accordance with examples as disclosed herein.
Figure 3B:
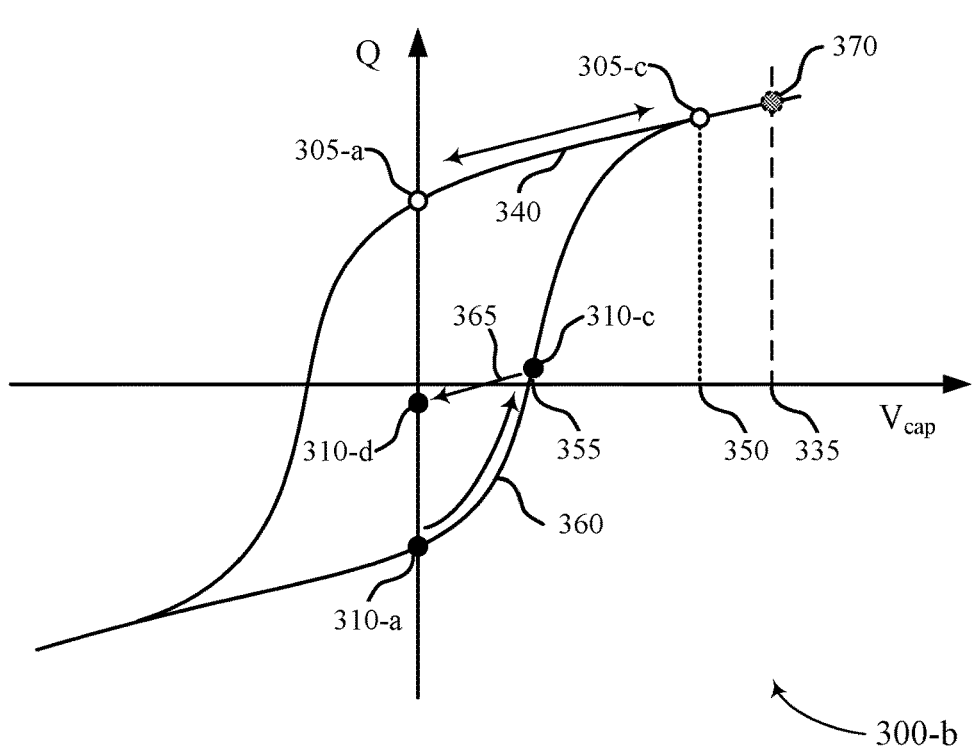

FIGS. 3A and 3B illustrate examples of non-linear electrical properties of a ferroelectric memory cell with hysteresis plots 300-*a* and 300-*b* in accordance with examples as disclosed herein. The hysteresis plots 300-*a* and 300-*b* may illustrate examples of a writing process and a reading process, respectively, for a memory cell 205 employing a ferroelectric capacitor 240 as described with reference to FIG. 2. The hysteresis plots 300-a and 300-b depict the charge, Q, stored on the ferroelectric capacitor 240 as a function of a voltage difference $V_{cap}$, between the terminals of the ferroelectric capacitor 240 (e.g., when charge is permitted to flow into or out of the ferroelectric capacitor according to the voltage difference $V_{cap}$). For example, the voltage difference $V_{cap}$ may represent the difference in voltage between a plate line side of the capacitor 240 and a digit line side of the capacitor 240 (e.g., a difference between a voltage at a plate node and a voltage at a bottom node, which may be referred to as $V_{plate}-V_{bottom}$, as illustrated in FIG. 2).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 240 described herein may include these or other ferroelectric materials. Electric polarization within a ferroelectric capacitor 240 results in a net charge at the surface of the ferroelectric material, and attracts opposite charge through the terminals of the ferroelectric capacitor 240. Thus, charge may be stored at the interface of the ferroelectric material and the capacitor terminals.

As depicted in the hysteresis plot 300-a, a ferroelectric material used in a ferroelectric capacitor 240 may maintain a positive or negative polarization when there is no net voltage difference between the terminals of the ferroelectric capacitor 240. For example, the hysteresis plot 300-a illustrates two possible polarization states, a charge state 305-a and a charge state 310-a, which may represent a negatively saturated polarization state and a positively saturated polarization state, respectively. The charge states 305-a and 310-a may be at a physical condition illustrating remnant polarization (Pr) values, which may refer to the polarization or charge that remains upon removing the external bias (e.g., voltage). According to the example of the hysteresis plot 300-a, the charge state 305-a may represent a logic 0 when no voltage difference is applied across the ferroelectric capacitor 240, and the charge state 310-a may represent a logic 1 when no voltage difference is applied across the ferroelectric capacitor 240. In some examples, the logic values of the respective charge states or polarization states may be reversed or interpreted in an opposite manner to accommodate other schemes for operating a memory cell 205.

A logic 0 or 1 may be written to the memory cell by controlling the electric polarization of the ferroelectric material, and thus the charge on the capacitor terminals, by applying a net voltage difference across the ferroelectric capacitor 240. For example, the voltage 315 may be a voltage equal to or greater than a positive saturation voltage, and applying the voltage 315 across the ferroelectric capacitor 240 may result in charge accumulation until the charge state 305-b is reached (e.g., writing a logic 0). Upon removing the voltage 315 from the ferroelectric capacitor 240 (e.g., applying a zero net voltage across the terminals of the ferroelectric capacitor 240), the charge state of the ferroelectric capacitor 240 may follow the path 320 shown between the charge state 305-b and the charge state 305-a at zero voltage across the capacitor. In other words, charge state 305-a may represent a logic 0 state at an equalized voltage across a ferroelectric capacitor 240 that has been positively saturated.

Similarly, voltage 325 may be a voltage equal to or lesser than a negative saturation voltage, and applying the voltage 325 across the ferroelectric capacitor 240 may result in charge accumulation until the charge state 310-b is reached (e.g., writing a logic 0). Upon removing the voltage 325 from the ferroelectric capacitor 240 (e.g., applying a zero net voltage across the terminals of the ferroelectric capacitor 240), the charge state of the ferroelectric capacitor 240 may follow the path 330 shown between the charge state 310-b and the charge state 310-a at zero voltage across the capacitor. In other words, charge state 310-a may represent a logic 0 state at an equalized voltage across a ferroelectric capacitor 240 that has been negatively saturated. In some examples, the voltage 315 and the voltage 325, representing saturation voltages, may have the same magnitude, but opposite polarity across the ferroelectric capacitor 240. Although the example of hysteresis plot 300-a illustrates a logic 0 corresponding to charge state 310-a, and a logic 1 corresponding to charge state 305-a, logic states may correspond to different charge states in some examples, such as a logic 0 corresponding to charge state 305-a and a logic 1 corresponding to charge state 310-a, among other examples.

To read, or sense, the stored state of a ferroelectric capacitor 240, a voltage may also be applied across the ferroelectric capacitor 240. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-a, or the charge state 310-a, or some other charge state was initially stored, among other factors.

The hysteresis plot 300-b illustrates examples of access operations for reading stored charge states (e.g., charge states 305-a and 310-a). In some examples, a read voltage 335 may be applied, for example, as a voltage difference via a plate line 220 and a digit line 215 as described with reference to FIG. 2. The hysteresis plot 300-b may illustrate read operations where the read voltage 335 is positive voltage difference $V_{cap}$ (e.g., where $V_{plate}-V_{bottom}$ is positive). A positive read voltage across the ferroelectric capacitor 240 may be referred to as a "plate high" read operation, where a plate line 220 is taken initially to a high voltage, and a digit line 215 is initially at a low voltage (e.g., a ground voltage). Although the read voltage 335 is shown as a positive voltage across the ferroelectric capacitor 240, in alternative access operations a read voltage may be a negative voltage across the ferroelectric capacitor 240, which may be referred to as a "plate low" read operation.

The read voltage 335 may be applied across the ferroelectric capacitor 240 while a memory cell 205 is selected (e.g., by activating a switching component 245 via a word line 210 as described with reference to FIG. 2). Upon applying the read voltage 335 to the ferroelectric capacitor 240, charge may flow into or out of the ferroelectric capacitor 240 via the associated digit line 215 and plate line 220, and, in some examples, different charge states or access line voltages may result depending on whether the ferroelectric capacitor 240 was at the charge state 305-a (e.g., a logic 0) or at the charge state 310-a (e.g., a logic 1), or some other charge state.

When performing a read operation on a ferroelectric capacitor 240 at the charge state 305-a (e.g., a logic 0), additional positive charge may accumulate across the ferroelectric capacitor 240, and the charge state may follow path 340 until reaching the charge and voltage of the charge state 305-*c*. The amount of charge flowing through the capacitor 240 may be related to the intrinsic or other capacitance of a digit line 215 (e.g., intrinsic capacitance of the digit line 215, capacitance of a capacitor or capacitive element coupled with the digit line 215, or a combination thereof), or other access line (e.g., a signal line opposite an amplifier, such as a charge transfer sensing amplifier, from a digit line 215). In a "plate high" read configuration, a read operation associated with the charge states 305-*a* and 305-*c*, or more generally a read operation associated with the logic 0 state, may be associated with a relatively small amount of charge transfer (e.g., compared to a read operation associated with the charge states 310-*a* and 310-*c*, or more generally, compared to reading the logic 1 state).

As shown by the transition between the charge state 305-*a* and the charge state 305-*c*, the resulting voltage 350 across the ferroelectric capacitor 240 may be a relatively large positive value due to the relatively large change in voltage at the capacitor 240 for the given change in charge. Thus, upon reading a logic 0 in a "plate high" read operation, the digit line voltage, equal to the difference of a plate line voltage, $V_{PL}$, and $V_{cap}$ (e.g., $V_{plate}-V_{bottom}$) at the charge state 310-*c*, may be a relatively low voltage. Such a read operation may not change the remnant polarization of the ferroelectric capacitor 240 that stored the charge state 305-*a* and thus, after performing the read operation, the ferroelectric capacitor 240 may return to the charge state 305-*a* via path 340 when the read voltage 335 is removed (e.g., by applying a zero net voltage across the ferroelectric capacitor 240, by equalizing the voltage across the ferroelectric capacitor 240). Thus, performing a read operation with a positive read voltage on a ferroelectric capacitor 240 with a charge state 305-*a* may be considered a non-destructive read process. In some cases, a rewrite operation may not be involved or may be omitted in such scenarios.

When performing the read operation on the ferroelectric capacitor 240 at the charge state 310-*a* (e.g., a logic 1), the stored charge may reverse polarity or may not reverse polarity as a net positive charge accumulates across the ferroelectric capacitor 240, and the charge state may follow the path 360 until reaching the charge and voltage of the charge state 310-*c*. The amount of charge flowing through the ferroelectric capacitor 240 may again be related to the intrinsic or other capacitance of the digit line 215. In a "plate high" read configuration, a read operation associated with the charge states 310-*a* and 310-*c*, or more generally a read operation associated with the logic 1 state, may be associated with a relatively large amount of charge transfer, or a relatively smaller capacitor voltage, $V_{cap}$ (e.g., compared to a read operation associated with the charge states 305-*a* and 305-*c*, or more generally, compared to reading the logic 0 state).

As shown by the transition between the charge state 310-*a* and the charge state 310-*c*, the resulting voltage 355 may, in some cases, be a relatively small positive value due to the relatively small change in voltage at the capacitor 240 for the given change in charge. Thus, upon reading a logic 1 in a "plate high" read operation, the digit line voltage, equal to the difference of a plate line voltage, $V_{PL}$, and $V_{cap}$ (e.g., $V_{plate}-V_{bottom}$) at the charge state 310-*c*, may be a relatively high voltage.

The transition from the charge state 310-*a* to the charge state 310-*c* may be illustrative of a sensing operation that is associated with a partial reduction or partial reversal in polarization or charge of a ferroelectric capacitor 240 of a memory cell 205 (e.g., a reduction in the magnitude of charge Q from the charge state 310-*a* to a charge state 310-*d*). In other words, according to the properties of the ferroelectric material, after performing the read operation the ferroelectric capacitor 240 may not return to the charge state 310-*a* when the read voltage 335 is removed (e.g., by applying a zero net voltage across the ferroelectric capacitor 240, by equalizing the voltage across the ferroelectric capacitor 240). Rather, when applying a zero net voltage across the ferroelectric capacitor 240 after a read operation of the charge state 310-*a* with read voltage 335, the charge state may follow path 365 from the charge state 310-*c* to the charge state 310-*d*, illustrating a net reduction in polarization magnitude (e.g., a less negatively polarized charge state than initial charge state 310-*a*, illustrated by the difference in charge between the charge state 310-*a* and the charge state 310-*d*). Thus, performing a read operation with a positive read voltage on a ferroelectric capacitor 240 with a charge state 310-*a* may be described as a destructive read process.

In some cases, a rewrite operation (e.g., applying a voltage 325) may be performed after performing such a read operation, which may cause the memory cell to transition from the charge state 310-*d* to the charge state 310-*a* (e.g., indirectly, such as via a charge state 310-*b*). In various examples, such a rewrite operation may be performed after any read operation, or may be performed based on some circumstances (e.g., when a read voltage is opposite from the write voltage associated with a detected logic state). However, in some sensing schemes, a reduced remnant polarization may still be read as the same stored logic state as a saturated remnant polarization state (e.g., supporting detection of a logic 1 from both the charge state 310-*a* and the charge state 310-*d*), thereby providing a degree of non-volatility for a memory cell 205 with respect to read operations.

In other examples (e.g., when a ferroelectric material is able to maintain polarization in the presence of at least some level of a depolarizing field, when a ferroelectric material has sufficient coercivity, not shown), after performing a read operation the ferroelectric capacitor 240 may return to the charge state 310-*a* when a read voltage is removed, and performing such a read operation with a positive read voltage on a ferroelectric capacitor 240 with a charge state 310-*a* may be described as a non-destructive read process. In such cases, rewrite operations may not be expected after such a read operation.

The position of the charge state 305-*c* and the charge state 310-*c* after initiating a read operation may depend on various factors, including the specific sensing scheme and circuitry. In some cases, the charge associated with a read operation may depend on the net capacitance of the digit line 215 coupled with the memory cell 205, which may include an intrinsic capacitance, integrator capacitors, and others. For example, if a ferroelectric capacitor 240 is electrically coupled with a digit line 215 initially at 0V and the read voltage 335 is applied to a plate line 220, the voltage of the digit line 215 may rise when the memory cell 205 is selected due to charge flowing from the ferroelectric capacitor 240 to the net capacitance of the digit line 215. Thus, in some examples, a voltage measured at a sense component 250 may not be equal to the read voltage 335, or the resulting voltages 350 or 355, and instead may depend on the voltage of the digit line 215 following a period of charge sharing.

The initial state (e.g., charge state, logic state) of the ferroelectric capacitor 240 may be determined by comparing the voltage of a digit line 215, or signal line, where applicable, resulting from the read operation with a reference voltage (e.g., a reference 255). In some examples, the digit line voltage may be the difference between the read voltage 335 and the final voltage across the capacitor 240 (e.g., (read voltage 335–voltage 350) when reading the ferroelectric capacitor 240 having a stored charge state 305-a, (read voltage 335–voltage 355) when reading the ferroelectric capacitor 240 having a stored charge state 310-a). In some examples, the digit line voltage may be the sum of the plate line voltage and the final voltage across the ferroelectric capacitor 240 (e.g., voltage 350 when reading the ferroelectric capacitor 240 having a stored charge state 305-a, or voltage 355 when reading the ferroelectric capacitor 240 having a stored charge state 310-a).

In some examples, read operations of a memory cell 205 may be associated with a fixed voltage of a digit line 215, where a charge state of a ferroelectric capacitor 240 after initiating a read operation may be the same regardless of its initial charge state. For example, in a read operation where a digit line 215 and plate line 220 are held at a fixed relative voltage that supports the read voltage 335, the ferroelectric capacitor 240 may proceed to a charge state 370 for both the case where the ferroelectric capacitor initially stored a charge state 305-a and the case where the ferroelectric capacitor initially stored a charge state 310-a. Accordingly, rather than using a difference in voltage (e.g., of a digit line 215) to detect an initial charge state or logic state, in some examples, the initial charge state or logic state of the ferroelectric capacitor 240 may be determined based at least in part on the difference in charge associated with the read operation. For example, as illustrated by hysteresis plot 300-b, a logic 0 may be detected based on difference in charge, Q, between charge state 305-a and charge state 370 (e.g., a relatively small amount of charge transfer), and a logic 1 may be detected based on a difference in charge, Q, between charge state 310-a and charge state 370 (e.g., a relatively large amount of charge transfer).

In some examples, such a detection may be supported by a charge-transfer sensing amplifier, a cascode (e.g., a transistor configured in a cascode arrangement), or other signal development circuitry between a digit line 215 and a signal line that is coupled with a sense amplifier, where a voltage of the signal line may be based at least in part on the amount of charge transfer of a capacitor 240 after initiating a read operation (e.g., where the described charge transfer may correspond to an amount of charge that passes through the charge-transfer sensing amplifier, cascode, or other signal development circuitry). In such examples, the voltage of the signal line may be compared with a reference voltage (e.g., at a sense component 250) to determine the logic state initially stored by the ferroelectric capacitor 240, despite the digit line 215 being held at a fixed voltage level.

In some examples, if a digit line 215 is held at a fixed read voltage 335, a capacitor 240 may be positively saturated after a read operation irrespective of whether the capacitor 240 was initially at a charge state 305-a (e.g., a logic 0) or initially at a charge state 310-a (e.g., a logic 1). Accordingly, after such a read operation, the capacitor 240 may, at least temporarily, be charged or polarized according to a logic 0 state irrespective of its initial or intended logic state. Thus, a rewrite operation may be expected at least when the capacitor 240 is intended to store a logic 1 state, where such a rewrite operation may include applying a write voltage 325 to store a logic 1 state as described with reference to hysteresis plot 300-a. Such rewrite operations may be configured or otherwise described as a selective rewrite operation, since a rewrite voltage may not be applied when the capacitor 240 is intended to store a logic 0 state. In some examples, such an access scheme may be referred to as a "2Pr" scheme, where the difference in charge for distinguishing a logic 0 from a logic 1 may be equal to two times the remnant polarization of a memory cell 205 (e.g., a difference in charge between charge state 305-a, a positively saturated charge state, and charge state 310-a, a negatively saturated charge state).

The examples of hysteresis plots 300-a and 300-b may be illustrative of normalized (e.g., equalized) behavior of a memory cell 205 including a ferroelectric capacitor 240 when subjected to write biasing or read biasing. However, based on various operating or environmental conditions, ferroelectric capacitors 240 may become imprinted with a particular logic state, which may refer to various conditions where a ferroelectric capacitor 240 becomes predisposed toward storing one logic state over another, resistant to being written to a different logic state (e.g., a logic state different than a stored logic state prior to a write operation), or both. For example, as compared with the hysteresis plots 300-a and 300-b, an imprinted ferroelectric capacitor 240 may be associated with a different (e.g., a higher coercivity or shifted coercivity with respect to changing or inverting a polarization state), a reduced saturation polarization, a shallower slope of polarization, or other characteristics that may be asymmetric with respect to different logic states. Memory arrays having imprinted ferroelectric capacitors 240 may be associated with read errors, write errors, or other behaviors that can impair operations of a memory device, or a system that includes a memory device. In accordance with examples as disclosed herein, imprinted ferroelectric capacitors 240 may be recovered using various imprint recovery or repair processes, such as applying one or more recovery pulses to memory cells of the memory arrays, where each recovery pulse includes a first portion with a first voltage magnitude and a second portion with a second voltage magnitude that is lower than the first voltage magnitude.

Figure 4:
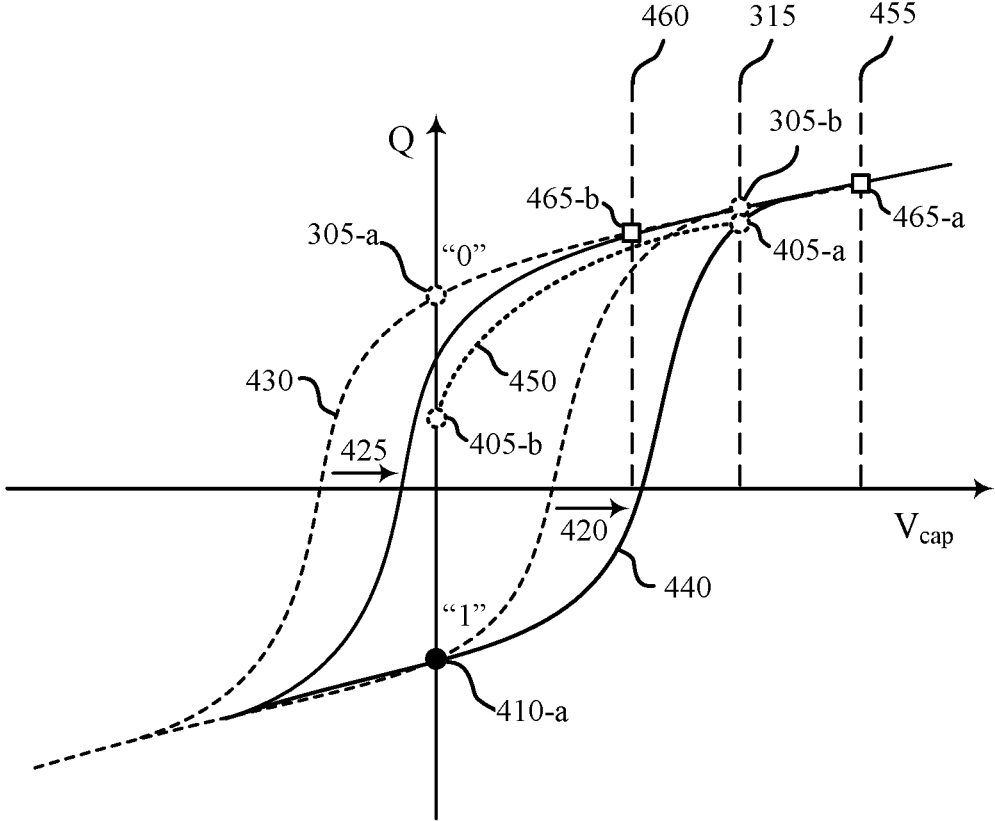
FIG. 4 illustrates an example of non-linear electrical properties of imprinted ferroelectric memory cells with a hysteresis plot in accordance with examples as disclosed herein.

FIG. 4 illustrates an example of non-linear electrical properties of imprinted ferroelectric memory cells with a hysteresis plot 400 in accordance with examples as disclosed herein. For example, the hysteresis plot 400 illustrates an example of characteristics of a ferroelectric capacitor 240 that may shift as a result of imprinting with a state (e.g., an imprinting with a logic 1, an imprinting with a charge state 410-a, which may be equal to the charge state 310-a or different than the charge state 310-a described with reference to FIGS. 3A and 3B), which may be related to an alteration of configuration of electrostatic domains in a ferroelectric memory cell 205. The shifted characteristics of the hysteresis plot 400, illustrated by imprinted hysteresis curve 440, may result from conditions during which a ferroelectric capacitor 240 has maintained a charge state for a relatively long duration, or maintained a charge state under relatively high temperature conditions, or both (e.g., under static bake conditions), among other conditions associated with memory cell imprint.

In some cases, the hysteresis plot 400 may be an example of a shift from an unimprinted hysteresis curve 430 to an imprinted hysteresis curve 440, which may be associated with various shifts in coercivity of a ferroelectric capacitor 240. For example, a ferroelectric capacitor 240 may experience a shift 420, associated with a shift in coercive voltage to change out of an imprinted polarization state (e.g., an increase in coercive voltage magnitude), or a shift 425, associated with a shift in coercive voltage to return to an imprinted polarization state (e.g., a decrease in coercive voltage magnitude), or both, in which case a shift 420 and a shift 425 may be associated with a same or similar amount of shift (e.g., along the voltage axis) or a different amount of shift. A shift to the imprinted hysteresis curve 440 may be associated with an increased resistance (e.g., an asymmetric resistance) to changing polarization during a write operation (e.g., associated with applying a voltage 315) or during a read operation (e.g., associated with applying a read voltage 335), such as a collective increase of resistance of domains from changing polarization state (e.g., where domains are able to have their polarization reversed, but where such a reversal collectively expects a relatively higher voltage bias).

For example, according to the hysteresis plot 400, when an imprinted ferroelectric capacitor 240 storing a charge state 410-*a* is biased with a voltage 315 (e.g., a write voltage associated with writing a logic 0), charge may accumulate until the charge state 405-*a* is reached. Compared with the charge state 305-*b*, which may correspond to a saturated condition of a normalized ferroelectric capacitor 240 (e.g., in accordance with the unimprinted hysteresis curve 430, where polarization of the ferroelectric capacitor may be fully reversed at the voltage 315), the charge state 405-*a* may not correspond to a saturated condition, and instead may illustrate an example of a partial polarization reversal in response to the write voltage 315. Such a response may be associated with the shift 420, corresponding to a change of the coercive voltage associated with positively saturating the ferroelectric capacitor 240, in which case the voltage 315 may not have a high enough magnitude to positively saturate the negatively imprinted ferroelectric capacitor 240.

Additionally, or alternatively, removing the voltage 315 from the ferroelectric capacitor 240 (e.g., applying a zero net voltage across the terminals of the ferroelectric capacitor 240 after applying the voltage 315) may be associated with a reduction in polarization relative to the charge state 405-*a*, such as during conditions in which a degree of imprinting may prevent domains (e.g., charge domains) from remaining in a written state. For example, when the voltage 315 is removed from the ferroelectric capacitor 240, the charge state of the ferroelectric capacitor 240 may follow the path 450 shown between the charge state 405-*a* and the charge state 405-*b* at zero voltage across the ferroelectric capacitor 240. In various examples, the charge state 405-*b* may have a lower charge than the charge state 305-*a* (e.g., a charge state of an unimprinted ferroelectric capacitor 240 corresponding to a logic 0 at an equalized voltage across the ferroelectric capacitor). Moreover, in some examples, the path 450 may include at least some loss of polarization (e.g., returning towards an imprinted charge state or polarization state when a write bias is removed), which may be referred to as backswitching, drop, or recoil. Such a response may be associated with the shift 425, corresponding to a change of the coercive voltage associated with negatively saturating the ferroelectric capacitor 240 (e.g., or losing a positive polarization), in which case the ferroelectric capacitor 240 may be unable to maintain at least some magnitude of positive polarization at an equalized voltage (e.g., unable to maintain a positive polarization associated with applying a voltage 315, including a relatively lower positive polarization associated with the charge state 405-*a*).

Although the hysteresis plot 400 illustrates the charge state 405-*b* as having a net charge, Q, that is positive, under various circumstances (e.g., various imprint severity, various degrees of coercivity shift, various degrees of polarization reversal among a set of domains of a ferroelectric capacitor 240), a net charge of a charge state 405-*b* may have a positive value or a negative value. Under various circumstances, the charge state 405-*b* may be illustrative of storing a logic 0 or a logic 1, or may be illustrative of a charge state that may be read by a memory device as storing a logic 0 or a logic 1, or may be considered as an indeterminate state. In other words, as a result of the shift from the unimprinted hysteresis curve 430 to the imprinted hysteresis curve 440, applying the voltage 315 to an imprinted memory cell 205 may not successfully write a logic 0 to a ferroelectric capacitor 240 imprinted with a logic 1, or may not support the ferroelectric capacitor 240 being successfully read as a logic 0, or both.

Although the hysteresis plot 400 illustrates simplified examples of mechanisms that may be related to imprinting in a ferroelectric capacitor 240, other mechanisms or conditions, or combinations thereof, may be associated with memory cell imprint. For example, a memory cell 205 imprinted with a logic 1 may not be associated with a charge state 310-*a* as described with reference to FIGS. 3A and 3B, and may have a different charge state 410-*a* after imprinting (e.g., due to charge degradation during imprint, due to saturation polarization collapse of an imprinted logic state or charge state during imprint itself, due to charge leakage, due to a change in saturation polarization that may change or reduce a charge state 410-*a* when rewritten with a logic 1 state, or any combination thereof). In another example, imprint may change (e.g., widen) a distribution of polarization reversal voltages across a set of domains in a ferroelectric capacitor 240, which may be associated with a shallower slope of Q versus $V_{cap}$ between one polarization state and another (e.g., across a polarization reversal region, in a region associated with a coercive voltage), which may be accompanied by a collective shift in coercivity or a change in polarization reversal capacity. In some examples, imprinting in a ferroelectric capacitor 240 may be associated with other phenomena, or various combinations of these and other phenomena.

To reduce a degree of imprint of memory cells 205 (e.g., to reduce or eliminate a shift 420, or a shift 425, or both, to return charge mobility of a memory cell 205 to a normalized state, to return to an unimprinted hysteresis curve 430, to restore a remnant polarization capacity, to normalize coercivity), a memory device 110 (e.g., a memory die 200) may perform an imprint recovery operation that includes one or more imprint recovery pulses. In some examples, imprint recovery may be supported by holding a memory cell 205 in an opposite polarization state (e.g., opposite from an imprinted state) over a long enough duration to alter the local electrostatic configuration that is causing a memory cell 205 to revert to the imprinted state. In some examples, recovery may be aided by time under applied bias (e.g., via a recovery pulse) and charge state switching (e.g., bias switching, charge switching, polarization switching, via recovery pulses having different polarities).

Regarding time under bias, mobile charge defects may change configuration within a memory cell 205 in alignment with the applied bias, which may also be aligned with an intended polarization state. In some examples, such a process may scale with total cumulative time under bias. However, the time under bias may be beneficial if the internal electric field aligns with the applied electric field. For example, significant buildup of local charge within a memory cell 205 may screen an applied field and prevent a local reconfiguration of defects in some parts of the memory cell 205. Although unipolar (e.g., non-switching, non-cycling) bias can be used to support imprint recovery, and have some advantages, cycling methods may be more effective in some examples.

Regarding charge state switching (e.g., polarization switching), in some examples, repeatedly switching polarity of an applied bias may provide repeated opportunities for domains within the memory cell 205 to undergo a stochastic switching event. For example, for domains that, according to a probability distribution, may or may not undergo a polarization switching event at a given voltage or bias, a repeated charge switching may provide more opportunities for such a domain to switch polarization, enhancing a probability that such a switching will actually occur. In some examples, state or bias switching may also raise an internal temperature of a memory cell 205, which may further enhance defect or domain mobility. Accordingly, both an increase in temperature and repeated opportunities for repolarization may aid imprint recovery of a memory cell 205.

Mechanisms such as these may contribute to phenomena that may be referred to as "wakeup" or "recovery" from an as-processed (e.g., time zero, initial, starting) imprint state of a memory cell 205. Such mechanisms may also contribute to recovery from fatigue, which may be related to charge domains that are symmetrically not participating in a polarization switching process (e.g., not participating in polarization switching whether switching from a logic 0 polarization to a logic 1 polarization or switching from a logic 1 polarization to a logic 0 polarization, which may be associated with a decrease in saturation polarization). In some examples, fatigue recovery may be driven by "waking up" domains within a memory cell 205 that had not previously been participating in polarization switching. Since fatigue may be defined as loss of polarization signal induced by repeated switching of a polarization state, recovery from fatigue may rely on variation in an applied bias (e.g., higher bias or longer pulses compared with typical or initial operating conditions).

In some examples, an imprint recovery pulse may include applying a voltage (e.g., a polarization voltage) across a memory cell 205 for a duration. For a memory cell 205 that includes a ferroelectric capacitor, for example, such a voltage may be associated with at least some degree of polarization that is opposite from an imprinted state (e.g., an imprinted charge, an imprinted polarization). For example, referring to the hysteresis plot 400, which may illustrate an imprint with a negative polarization (e.g., a negative imprint polarity), an imprint recovery pulse may include applying a voltage associated with a positive polarization (e.g., a positive polarity) for some duration over which polarization behavior may equalize (e.g., to encourage a return symmetric coercive voltages, to encourage a return symmetric polarization characteristics).

In some examples, maintaining a relatively high voltage magnitude during an imprint recovery pulse may be associated with unnecessary power consumption. For example, various portions of a memory die 200 may be associated with charge leakage, including inadvertent leakage paths through dielectric portions of a memory die, or intentional leakage paths that support configured shunting characteristics, among others. Maintaining a relatively high voltage magnitude during an imprint recovery pulse in the presence of such leakage paths may accordingly be associated with relatively high power consumption. However, some memory architectures may not require a relatively high voltage magnitude over an entire duration of an imprint recovery pulse.

In an illustrative example, imprint recovery of a ferroelectric capacitor 240 may be correlated with a duration over which a polarization is maintained at the ferroelectric capacitor 240 (e.g., as a time under polarization), which may not necessarily involve maintaining a polarizing voltage itself across the ferroelectric capacitor 240. Rather, during an imprint recovery pulse, a voltage with a relatively high magnitude may be implemented to establish a level of polarization at the ferroelectric capacitor 240 and such biasing may be reduced, along a linear region of the associated hysteresis curve (e.g., without reaching or approaching an opposite coercive voltage), in a manner that reduces charge but maintains polarization. Thus, the effectiveness of an imprint recovery pulse may be maintained (e.g., relative to a given degree of polarization), but at a lower voltage that is associated with less charge leakage and therefore lower power consumption.

In accordance with examples as disclosed herein, an imprint recovery pulse may include biasing a memory cell 205 with a first voltage, such as a voltage 455, which may be associated with an imprint recovery polarization (e.g., a saturation polarization) of an imprinted memory cell 205 at a charge state 465-*a*. Although the voltage 455 is illustrated as having a greater magnitude than the voltage 315 (e.g., a write voltage), in some examples, the voltage 455 may have a same magnitude as the voltage 315 or a lower magnitude than the voltage 315. After reaching the charge state 465-*a*, the biasing may be reduced to a voltage having the same polarity as the voltage 455 but with a lower magnitude, such as a voltage 460. The voltage 460 may be associated with the same degree of polarization as the voltage 455, but at a relatively reduced voltage and charge state 465-*b* (e.g., maintaining the polarization as established by the voltage 455). Charge leakage in the associated memory device 110 may be relatively reduced at the relatively lower magnitude voltage 460, which may support a reduction in power consumption for the same or similar effectiveness of imprint recovery.

In some examples, a magnitude of the voltage 455, or of the voltage 460, or both may be based on a detected or inferred degree (e.g., severity) of imprint of memory cells 205. For example, a relatively higher magnitude of the voltage 455 may be implemented for conditions associated with a relatively larger shift 420 (e.g., to ensure a degree of polarization, such a saturation polarization), or a relatively higher magnitude of the voltage 460 may be implemented for conditions associated with a relatively larger shift 425 (e.g., to prevent or limit a degree of backswitching after applying the voltage 455). In various examples, a memory device 110, or a host device 105, or both may detect various operating conditions to infer a degree of imprint, which may support the determination of the voltage 455, or the voltage 460, or both. For example, a memory device 110, or a host device 105, or both may monitor such conditions as a duration of memory cells 205 storing certain logic states, or a temperature associated with the memory cells 205 (e.g., while storing certain logic states), among other conditions associated with a degree of imprint (e.g., detected error conditions). In some examples, the memory device 110 may determine the values of the voltage 455, or the voltage 460, or both, for performing an imprint recovery procedure at the memory device 110. In some other examples, a host device 105 may determine the values of the voltage 455, or the voltage 460, or both, for the memory device 110 to perform an imprint recovery procedure, and may transmit signaling to the memory device 110 indicating the voltage 455, or the voltage 460, or both (e.g., indicating a magnitude of such voltages). In some examples, such determinations of the voltage 455 or the voltage 460 may support configuring imprint recovery pulses with a magnitude sufficient to support imprint recovery but without a magnitude associated with undue power consumption.

Although some aspects of memory cell imprint are described with reference to ferroelectric memory applications, imprint management in accordance with the present disclosure may also be applicable to other memory technologies that undergo drift or other shifts in characteristics that may be asymmetric with respect to different logic states. For example, material memory elements, such as phase change, resistive, or thresholding memories may undergo material segregation or immobilization as a result of memory cell imprint (e.g., as a result of storing a logic state over a duration, as a result of storing a logic state at an elevated temperature), where such effects may be associated with (e.g., asymmetrically associated with, drift towards) storing or reading a particular logic state over another. In some examples, memory cells 205 in such applications that are imprinted may be associated with an increased resistance to changing from one configurable material property or characteristic to another, which may correspond to such phenomena as a relatively greater resistance to changes from one threshold voltage to another, a relatively greater resistance to changes from one electrical resistance to another, and other characteristics. In various examples, an imprint recovery operation in accordance with examples as disclosed herein may normalize (e.g., equalize) characteristics of material memory elements, such as normalizing material distributions, moving defects to one end or another, distributing defects more evenly through a cell, or mobilizing a material memory element to undergo atomic reconfiguration, among other examples.

Figure 5:
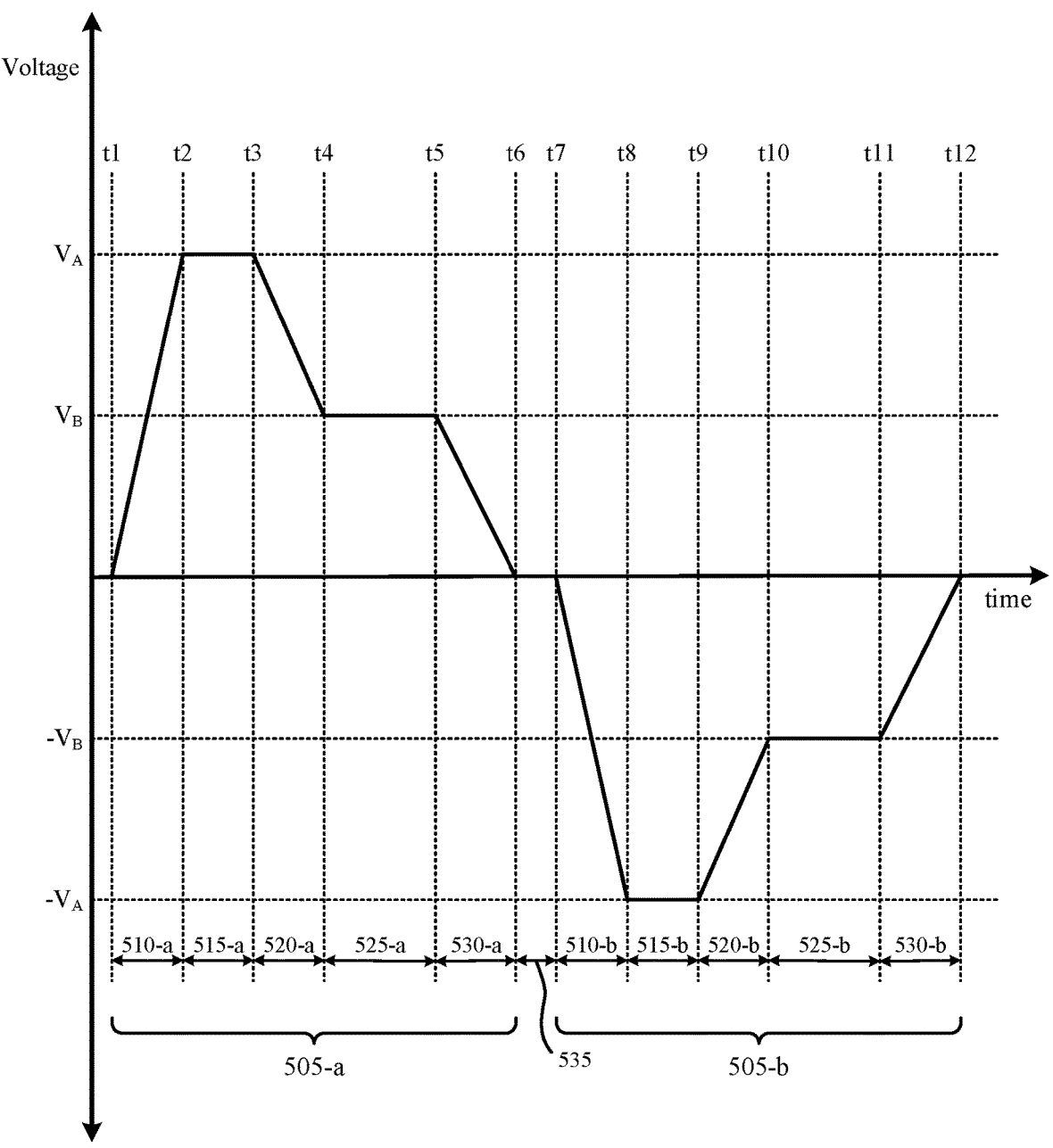
FIGS. 5 and 6 illustrate examples of timing diagrams that support switch and hold biasing for memory cell imprint recovery in accordance with examples as disclosed herein.

FIG. 5 illustrates an example of a timing diagram 500 that supports switch and hold biasing for memory cell imprint recovery in accordance with examples as disclosed herein. The timing diagram 500 illustrates examples of biasing in accordance with voltage pulses 505 (e.g., imprint recovery pulses) that may be implemented by a memory device 110 (e.g., a memory die 200) during an imprint recovery procedure. In various examples, a memory device 110 may determine to perform such an imprint recovery procedure (e.g., after a power on, after detecting a failure when reading a reference pattern stored in a memory array 170 of the memory device 110, based on a time or temperature of storing logic states at the memory device 110), or the memory device 110 may perform such an imprint recovery procedure in response to a command from a host device 105 (e.g., a command transmitted in response to operating conditions detected by the host device 105, such as time, temperature, or error conditions, or various combinations thereof). The illustrated biasing may be applied to one or more memory cells 205 of the memory device 110 in accordance with various techniques for imprint recovery (e.g., with a voltage source via one or more digit lines 215, with a voltage source via one or more plate lines 220, while one or more word lines 210 are activated) where, in various scenarios, such concurrently-biased memory cells 205 may be associated with the same direction of imprint or different directions of imprint.

The voltage pulse 505-a may be an example of a recovery pulse associated with a positive polarity. In some examples (e.g., for a unipolar recovery procedure), the voltage pulse 505-a may be selected based on the memory device 110 or a host device 105 detecting a negative imprint polarity to be corrected by one or more imprint recovery pulses having a positive polarity. In such examples, the voltage pulse 505-a may not be followed by a voltage pulse 505 having a negative polarity (e.g., in an example of the timing diagram 500 that omits the voltage pulse 505-b). In some alternative examples, an initial voltage pulse 505 having a negative polarity may be implemented in response to detecting a positive imprint polarity. In some other examples, an initial voltage pulse 505 having a positive polarity, or a negative polarity, may be a default condition and may be followed by one or more voltage pulses having an opposite polarity (e.g., voltage pulse 505-b).

At t1, the biasing of the voltage pulse 505-a may include coupling one or more memory cells 205 with one or more voltage sources in accordance with a voltage $V_A$. The voltage $V_A$ may correspond to an imprint recovery polarization voltage, such as a voltage 455, where a magnitude of the voltage $V_A$ may be determined by the memory device 110, or may be determined by a host device 105 and indicated to the memory device 110, or may be a value configured at the memory device 110 (e.g., a default value, a preconfigured value). Over a duration 510, voltage across the memory cells 205 may settle (e.g., rise, in the example of duration 510-a) which may be associated with accumulating charge across ferroelectric capacitors 240, or along an intrinsic capacitance between the ferroelectric capacitors 240 and the voltage sources, among other characteristics associated with the voltage transition during a duration 510.

At t2, the biasing of the memory cells 205 may reach the voltage $V_A$, which may be held over a duration 515 (e.g., a duration 515-a, where the memory cells 205 may be coupled with one or more voltage sources in accordance with a first voltage magnitude during both the duration 510-a and the duration 515-1). At or before t3, the memory cells 205 may be polarized in accordance with the voltage $V_A$ (e.g., having reached a charge state 465-a, which may be associated with a saturation polarization). In some examples, a duration between t1 and t3 (e.g., a combination of a duration 510 and a duration 515) may configured to account for different voltage settling times to ensure a polarization of the memory cells 205 during a voltage pulse 505. In some examples, a duration 515 may be configured as a relatively high-magnitude voltage hold duration, supporting aspects of imprint recovery at the polarization and the relatively high voltage magnitude associated with the voltage $V_A$, in combination with other aspects of imprint recovery during later durations of a voltage pulse 505. In some examples, a duration 515 may be nearly zero (e.g., a duration associated with reaching a charge state 465-a, but not necessarily holding at the charge state 465-a), which may support a relatively greater reduction in power consumption during a voltage pulse 505 (e.g., by limiting a duration at the relatively higher magnitude of voltage $V_A$).

At t3, the biasing of the voltage pulse 505-a may include initiating a reduction of the biasing (e.g., of the voltage pulse 505-a, of the memory cells 205, a magnitude reduction) from the voltage $V_A$ to a voltage $V_B$. The voltage $V_B$ may correspond to a voltage that maintains a level of polarization associated with the voltage $V_A$ (e.g., a voltage higher than a coercive voltage associated with a negative polarization, a voltage or charge state before a depolarization region), such as a voltage 460, where a magnitude of the voltage $V_B$ may be determined by the memory device 110, or may be determined by a host device 105 and indicated to the memory device 110, or may be a value configured at the memory device 110 (e.g., a default value, a preconfigured value). In various examples, the reduction in biasing may be implemented at t3 as a decrease in voltage of the voltage sources coupled at t1, or by coupling the memory cells 205 with one or more different voltage sources, among other techniques. Over a duration 520, a voltage across the memory cells 205 may settle (e.g., fall, in the example of duration 520-a) which may be associated with a reduction of charge across a ferroelectric capacitor 240 (e.g., as a transition from a charge state 465-a to a charge state 465-b), or along an intrinsic capacitance between the ferroelectric capacitors 240 and the voltage sources, among other characteristics associated with the voltage setting during a duration 520. The setting during a duration 520 may be configured such that the biasing does not overshoot (e.g., fall below, in the example of duration 520-*a*) the voltage $V_B$, or may be configured such that any overshoot past $V_B$ is small enough to avoid or limit a loss of polarization established by the biasing during a duration 515.

At t4, the biasing of the memory cells 205 may reach the voltage $V_B$, which may be held over a duration 525 (e.g., a duration 525-*a*, where the memory cells 205 may be coupled with one or more voltage sources in accordance with a second magnitude during both the duration 520-*a* and the duration 525-*a*). For example, during the duration 525-*a*, the memory cells 205 may maintain the level of polarization (e.g., a positive polarization in the case of voltage pulse 505-*a*) established with the voltage $V_A$, but at the lower voltage magnitude of $V_B$. Thus, in some examples, a duration 515, a duration 520, and a duration 525 may support at least some of the memory cells 205 reverting to a normalized condition (e.g., recovering from an imprint with a negative polarization) in accordance with a level of polarization (e.g., positive polarization) associated with the voltage $V_A$, but with the duration 520 and the duration 525 being associated with a lower power consumption than the duration 515, due at least in part to a reduction in leakage charge. For example, in an illustrative configuration where $V_A$ is set to 1.5V and $V_B$ is set to 100 mV, the described techniques for switch and hold biasing for imprint recovery during a duration 525 may reduce power consumption associated with charge leakage by over 99% compared to a duration 515 (e.g., under circumstances where leakage power is proportional to voltage squared).

At t5, the biasing of the voltage pulse 505-*a* may include removing the biasing (e.g., of the voltage pulse 505-*a*, of the memory cells 205) of the voltage $V_B$, which may include decoupling the memory cells 205 from the voltage sources or otherwise equalizing a voltage across the memory cells 205. Over a duration 525, a voltage across the memory cells 205 may proceed to zero volts, which may be associated with reducing charge across the ferroelectric capacitors 240, or along an intrinsic capacitance between the ferroelectric capacitors 240 and the voltage sources, among other characteristics associated with a voltage settling (e.g., equalization) during a duration 530.

In some examples, a voltage pulse 505 may be followed by one or more other voltage pulses 505, including one or more voltage pulses 505 having a same polarity, or one or more voltage pulses 505 having an opposite polarity, or various combinations thereof (e.g., a sequence of voltage pulses 505 having alternating polarities). For example, the timing diagram 500 illustrates an example where the voltage pulse 505-*a* is followed by a voltage pulse 505-*b*, having an opposite polarity (e.g., a negative polarity), which may support aspects of a bipolar imprint recovery procedure (e.g., where a direction of imprint may not be detected, to support imprint recovery techniques associated with charge state switching).

At t7, the biasing of the voltage pulse 505-*b* may include coupling the one or more memory cells 205 with one or more voltage sources in accordance with a voltage $-V_A$ (e.g., a voltage having the same magnitude as voltage $V_A$, but with an opposite polarity) where, over a duration 510-*b*, voltage across the memory cells 205 may fall. At t8, the biasing of the memory cells 205 may reach the voltage $-V_A$, which may be held over a duration 515-*b*. At or before t9, the memory cells 205 may be polarized in accordance with the voltage $-V_A$. At t9, the biasing of the voltage pulse 505-*b* may include initiating a reduction of a magnitude of the biasing from the voltage $-V_A$ to a voltage $-V_B$ (e.g., a voltage having the same magnitude as voltage $V_B$, but with an opposite polarity), where the voltage $-V_B$ may be configured to maintain a level of polarization associated with the voltage $-V_A$. Over a duration 520-*b*, a voltage across the memory cells 205 may rise and, at t10, the biasing of the memory cells 205 may reach the voltage $V_B$, which may be held over a duration 525-*b*.

During the duration 515-*b*, the duration 520-*b*, and the duration 525-*b*, the memory cells 205 may maintain the level of polarization (e.g., a negative polarization) established with the voltage $-V_A$, but at the lower voltage magnitude of $-V_B$. Thus, in some examples, the duration 515-*b*, the duration 520-*b*, and the duration 525-*b* may support at least some of the memory cells 205 reverting to a normalized condition (e.g., recovering from an imprint with a positive polarization) in accordance with a level of polarization (e.g., a negative polarization) associated with the voltage $-V_A$, but with a power consumption during the duration 520-*b* and the duration 525-*b* being lower than the duration 515-*b*, due at least in part to a reduction in leakage charge. At t11, the biasing of the voltage pulse 505-*b* may include removing the biasing of the voltage $-V_B$, which may include decoupling the memory cells 205 from the voltage sources or otherwise equalizing a voltage across the memory cells 205.

Although the example of timing diagram 500 illustrates an example where voltage pulses 505-*a* and 505-*b* are separated by a gap duration 535, in some examples, such a gap duration may be omitted. Further, in some examples, the memory cells 205 may not be explicitly equalized between voltage pulses 505. For example, referring to the examples of voltage pulses 505-*a* and 505-*b*, rather than decoupling the memory cells 205 from voltage sources at t5, the memory cells 205 may be biased in accordance with the voltage $-V_A$ (e.g., in accordance with the operations of t7, but at the timing of t5).

The voltages and timing of the operations of timing diagram 500 are for illustrative purposes and are not meant to indicate a particular relative voltage or a particular relative duration between one operation and another. For example, various operations in accordance with examples as disclosed herein may occur over a duration that is relatively shorter or relatively longer than illustrated, or with voltages that are relatively closer or farther in magnitude, among other differences. Further, various operations illustrated in the timing diagram 500 may occur over overlapping or concurrent durations in support of the techniques described herein.

Figure 6:

FIG. 6 illustrates an example of a timing diagram 600 that supports switch and hold biasing for memory cell imprint recovery in accordance with examples as disclosed herein. The timing diagram 600 illustrates an example of imprint recovery biasing in accordance with a staggered application of voltage pulses 505, which may be applied to different sections of a memory array (e.g., different rows of memory cells 205, different columns of memory cells 205, different banks of memory cells 205). For example, the timing diagram 600 illustrates an example of staggering the application of two voltage pulses 505 (e.g., a voltage pulse 505-*c* associated with a first section and a voltage pulse 505-*d* associated with a second section), which may reduce a peak current (e.g., a peak power consumption) associated with an imprint recovery procedure compared with such biasing of the different sections with the same timing. Although the example of timing diagram 600 illustrates the staggered application of two voltage pulses 505 (e.g., associated with two different sections of a memory array), the described techniques may be extended to any quantity of voltage pulses 505 applied in parallel (e.g., with any quantity of sections of memory cells 205), which may include various examples of voltage pulses 505 having the same polarity, or voltage pulses 505 having different polarities, or various combinations thereof (e.g., a sequence of voltage pulses 505 applied to a given section in accordance with the same polarity or alternating polarities).

The voltage pulse 505-*c* may be applied in accordance with durations 510-*c*, 515-*c*, 520-*c*, 525-*c*, and 535-*c*, which may be examples of the respective durations described with reference to FIG. 5. For example, during the durations 510-*c* and 515-*c*, a first section of one or more memory cells 205 may be coupled with one or more voltage sources in accordance with the voltage $V_A$ and, during the durations 520-*c* and 525-*c*, the first section of one or more memory cells 205 may be coupled with one or more voltage sources in accordance with the voltage $V_B$. In some examples, the duration 510-*c*, or the durations 510-*c* and 515-*c*, may be associated with relatively high current (e.g., associated with a charge transfer during the duration 510-*c* to settle to the voltage $V_A$, associated with a polarization of memory cells 205 of the section, associated with charge leakage in accordance with the voltage $V_A$). In some examples, to reduce a peak current associated with an imprint recovery procedure, it may be beneficial to delay the timing of a voltage pulse 505 for the second section of one or more memory cells 205 relative to the timing of the voltage pulse 505-*c*.

The voltage pulse 505-*d* illustrates an example of such staggering relative to the voltage pulse 505-*c*, where the voltage pulse 505-*d* may be applied in accordance with durations 510-*d*, 515-*d*, 520-*d*, 525-*d*, and 535-*d*. As illustrated, the durations 510-*d*, 515-*d*, 520-*d*, 525-*d*, and 535-*d* are delayed relative to the timing of the respective durations of the voltage pulse 505-*c* (e.g., in accordance with a delay 610). For example, at t1d, memory cells 205 of the second section may be coupled with one or more voltage sources in accordance with the voltage $V_A$, which may coincide with the memory cells 205 of the first section being coupled with one or more voltage sources in accordance with the voltage $V_B$ (e.g., a voltage magnitude reduction). Thus, in the example of voltage pulses 505-*c* and 505-*d*, a single section of memory cells 205 may be coupled with a relatively high voltage magnitude (e.g., a magnitude of the voltage $V_A$) at a time.

In another example, voltage pulses 505 may be staggered in accordance with a reduced timing shift compared to the illustration of timing diagram 600 (e.g., a delay of less than the delay 610). For example, for circumstances in which a current consumption during a duration 515 is relatively low compared to a duration 510, an end of a duration 510 for one section may be followed by (e.g., directly) a duration 510 of another section. Referring to the example of operation timing of the voltage pulses 505-*c* and 505-*d*, such circumstances may correspond to the timing of t1d coinciding with the timing of t2c. More generally, such techniques for staggering may include the duration 510-*d* overlapping, at least in part, with the duration 515-*c*, or the duration 520-*c*, or both. Additionally, or alternatively, such techniques for staggering may include the duration 515-*d* overlapping, at least in part, with the duration 520-*c*, or the duration 525-*c*, or both, among other examples. In some other examples, such staggering may be further tightened to accommodate other combinations of sections (e.g., a greater quantity of sections), such as configuring a time t1d between the times t1c and t2c (e.g., where the duration 510-*d* may be partially overlapping with the duration 510-*c*), and so on, among other examples. In accordance with these and other examples, imprint recovery procedures may be performed over a shorter overall duration, or across a greater quantity of sections, or both for a given peak current (e.g., a given power consumption).

Figure 7:
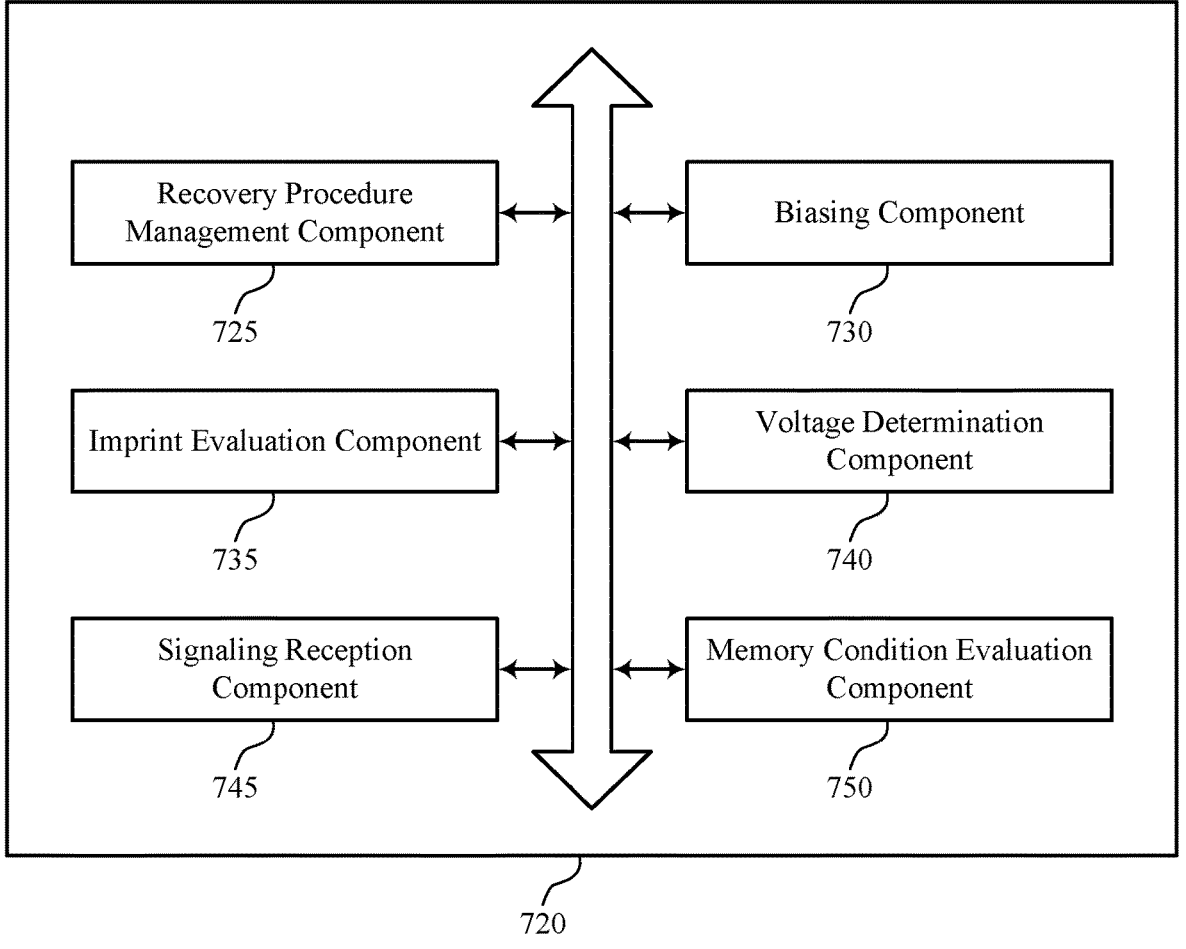
FIG. 7 shows a block diagram of a memory device that supports switch and hold biasing for memory cell imprint recovery in accordance with examples as disclosed herein.

FIG. 7 shows a block diagram 700 of a memory device 720 that supports switch and hold biasing for memory cell imprint recovery in accordance with examples as disclosed herein. The memory device 720 may be an example of aspects of a memory device as described with reference to FIGS. 1 through 6. The memory device 720, or various components thereof, may be an example of means for performing various aspects of switch and hold biasing for memory cell imprint recovery as described herein. For example, the memory device 720 may include a recovery procedure management component 725, a biasing component 730, an imprint evaluation component 735, a voltage determination component 740, a signaling reception component 745, a memory condition evaluation component 750, or any combination thereof. Each of these components may communicate, directly or indirectly, with one another (e.g., via one or more buses).

The recovery procedure management component 725 may be configured as or otherwise support a means for determining to perform an imprint recovery procedure on one or more memory cells of a memory array. The biasing component 730 may be configured as or otherwise support a means for biasing a memory cell of the one or more memory cells, during a first duration of a voltage pulse, with a first voltage magnitude having a voltage polarity based at least in part on determining to perform the imprint recovery procedure. In some examples, the biasing component 730 may be configured as or otherwise support a means for reducing the biasing of the memory cell, during a second duration of the voltage pulse after the first duration, from the first voltage magnitude to a second voltage magnitude having the voltage polarity. In some examples, the biasing component 730 may be configured as or otherwise support a means for holding the biasing of the memory cell, during a third duration of the voltage pulse after the second duration, at the second voltage magnitude having the voltage polarity.

In some examples, the biasing of the memory cell may be reduced during the second duration without falling below the second voltage magnitude between the first duration and the third duration.

In some examples, the first voltage magnitude may be associated with a polarization of a ferroelectric capacitor of the memory cell, and the second voltage magnitude may be associated with maintaining the polarization of the ferroelectric capacitor.

In some examples, the imprint evaluation component 735 may be configured as or otherwise support a means for identifying an indication of a severity of imprint of the one or more memory cells of the memory array. In some examples, the voltage determination component 740 may be configured as or otherwise support a means for determining the second voltage magnitude based at least in part on the indication of the severity of imprint, and reducing the biasing of the memory cell during the second duration and holding the biasing of the memory cell during the third duration is based at least in part on the determined second voltage magnitude.

In some examples, the memory condition evaluation component 750 may be configured as or otherwise support a means for determining a duration of storing logic states at the memory array, or a temperature associated with the memory array, or both, and identifying the indication of the severity of imprint is based at least in part on the duration of storing logic states, or the temperature, or both.

In some examples, the signaling reception component 745 may be configured as or otherwise support a means for receiving signaling from a host device, and determining to perform the imprint recovery procedure may be based at least in part on the signaling from the host device.

In some examples, the signaling reception component 745 may be configured as or otherwise support a means for receiving signaling from the host device that indicates the second voltage magnitude, and reducing the biasing of the memory cell during the second duration and holding the biasing of the memory cell during the third duration may be based at least in part on the indicated second voltage magnitude.

In some examples, the biasing component 730 may be configured as or otherwise support a means for biasing the memory cell, during a fourth duration of a second voltage pulse after the third duration, with the first voltage magnitude having a second voltage polarity based at least in part on determining to perform the imprint recovery procedure. In some examples, the biasing component 730 may be configured as or otherwise support a means for reducing the biasing of the memory cell, during a fifth duration of the second voltage pulse after the fourth duration, from the first voltage magnitude to the second voltage magnitude having the second voltage polarity. In some examples, the biasing component 730 may be configured as or otherwise support a means for holding the biasing of the memory cell, during a sixth duration of the second voltage pulse after the fifth duration, at the second voltage magnitude having the second voltage polarity.

In some examples, the biasing component 730 may be configured as or otherwise support a means for biasing a second memory cell of the one or more memory cells, during a seventh duration of a third voltage pulse after the first duration, with the first voltage magnitude having the voltage polarity based at least in part on determining to perform the imprint recovery procedure. In some examples, the biasing component 730 may be configured as or otherwise support a means for reducing the biasing of the second memory cell, during an eighth duration of the third voltage pulse after the seventh duration, from the first voltage magnitude to the second voltage magnitude having the voltage polarity. In some examples, the biasing component 730 may be configured as or otherwise support a means for holding the biasing of the second memory cell, during a ninth duration of the third voltage pulse after the eighth duration, at the second voltage magnitude having the voltage polarity.

In some examples, the seventh duration may be overlapping with the second duration, or the third duration, or both the second duration and the third duration.

Figure 8:
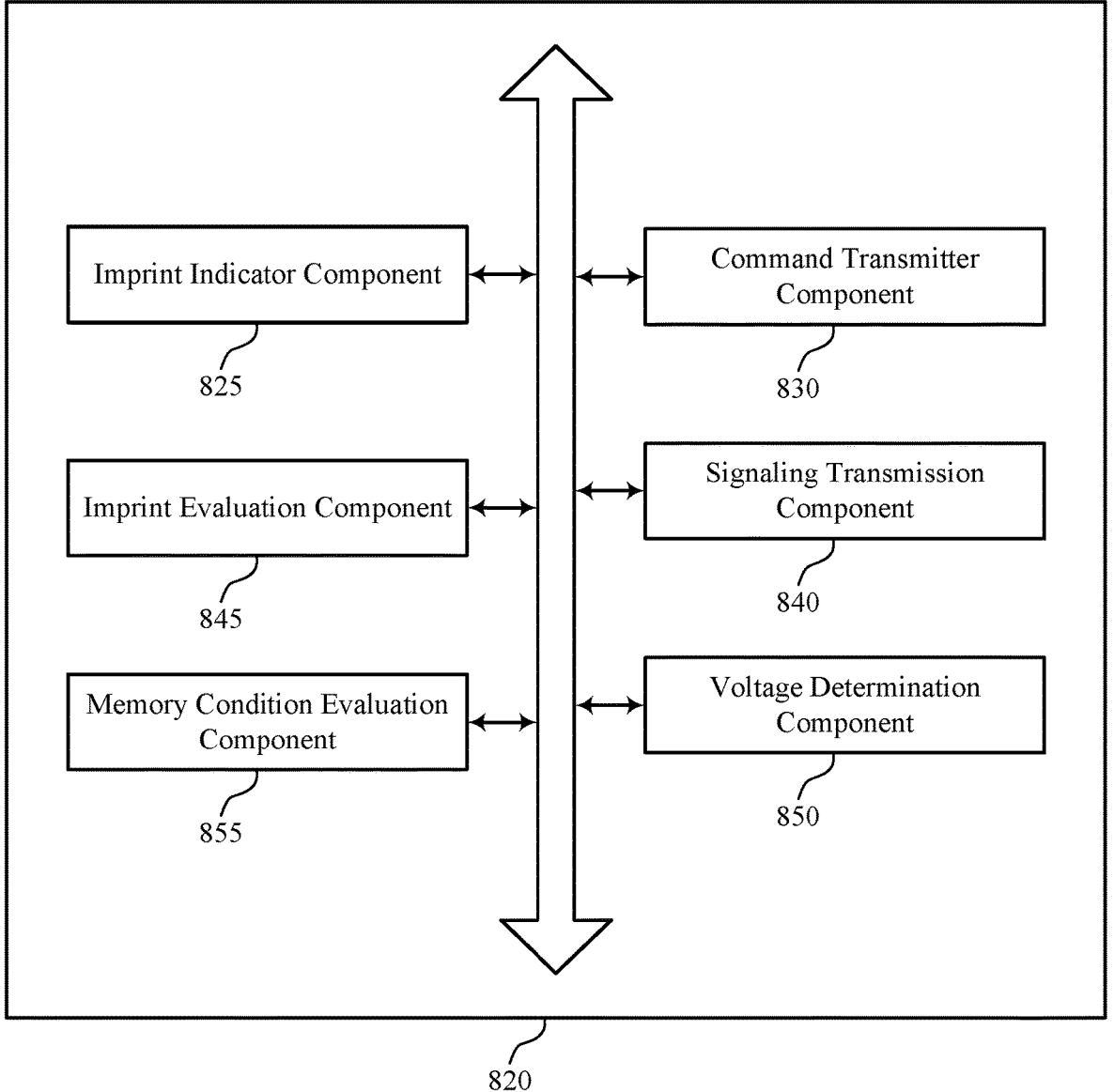
FIG. 8 shows a block diagram of a host device that supports switch and hold biasing for memory cell imprint recovery in accordance with examples as disclosed herein.

FIG. 8 shows a block diagram 800 of a host device 820 that supports switch and hold biasing for memory cell imprint recovery in accordance with examples as disclosed herein. The host device 820 may be an example of aspects of a host device as described with reference to FIGS. 1 through 6. The host device 820, or various components thereof, may be an example of means for performing various aspects of switch and hold biasing for memory cell imprint recovery as described herein. For example, the host device 820 may include an imprint indicator component 825, a command transmitter component 830, a signaling transmission component 840, an imprint evaluation component 845, a voltage determination component 850, a memory condition evaluation component 855, or any combination thereof. Each of these components may communicate, directly or indirectly, with one another (e.g., via one or more buses).

The imprint indicator component 825 may be configured as or otherwise support a means for determining, at a host device, a condition indicative of imprinted memory cells of a memory device. The command transmitter component 830 may be configured as or otherwise support a means for transmitting a command to perform an imprint recovery procedure based at least in part on determining the condition indicative of imprinted memory cells. In some examples, the imprint recovery procedure may include biasing a memory cell of the memory device, during a first duration, with a first voltage magnitude in accordance with a voltage polarity, reducing the biasing of the memory cell, during a second duration after the first duration, from the first voltage magnitude to a second voltage magnitude in accordance with the voltage polarity, and holding the biasing of the memory cell, during a third duration after the second duration, at the second voltage magnitude in accordance with the voltage polarity.

In some examples, the first voltage magnitude may be associated with a polarization of a ferroelectric capacitor of the memory cell, and the second voltage magnitude may be configured to maintain the polarization of the ferroelectric capacitor.

In some examples, the signaling transmission component 840 may be configured as or otherwise support a means for transmitting signaling that indicates the second voltage magnitude.

In some examples, the imprint evaluation component 845 may be configured as or otherwise support a means for identifying an indication of a severity of imprint. In some examples, the voltage determination component 850 may be configured as or otherwise support a means for determining the second voltage magnitude based at least in part on the indication of the severity of imprint.

In some examples, the memory condition evaluation component 855 may be configured as or otherwise support a means for detecting a duration of storing logic states at the memory device, or a temperature associated with the memory device, or both, and identifying the indication of the severity of imprint may be based at least in part on the duration of storing logic states, or the temperature, or both.

FIG. 9 shows a flowchart illustrating a method 900 that supports switch and hold biasing for memory cell imprint recovery in accordance with examples as disclosed herein. The operations of method 900 may be implemented by a memory device or its components as described herein. For example, the operations of method 900 may be performed by a memory device as described with reference to FIGS. 1 through 7. In some examples, a memory device may execute a set of instructions to control the functional elements of the device to perform the described functions. Additionally, or alternatively, the memory device may perform aspects of the described functions using special-purpose hardware.

At 905, the method may include determining to perform an imprint recovery procedure on one or more memory cells of a memory array. The operations of 905 may be performed in accordance with examples as disclosed herein. In some examples, aspects of the operations of 905 may be performed by a recovery procedure management component 725 as described with reference to FIG. 7.

At 910, the method may include biasing a memory cell of the one or more memory cells, during a first duration of a voltage pulse, with a first voltage magnitude having a voltage polarity based at least in part on determining to perform the imprint recovery procedure. The operations of 910 may be performed in accordance with examples as disclosed herein. In some examples, aspects of the operations of 910 may be performed by a biasing component 730 as described with reference to FIG. 7.

At 915, the method may include reducing the biasing of the memory cell, during a second duration of the voltage pulse after the first duration, from the first voltage magnitude to a second voltage magnitude having the voltage polarity. The operations of 915 may be performed in accordance with examples as disclosed herein. In some examples, aspects of the operations of 915 may be performed by a biasing component 730 as described with reference to FIG. 7.

At 920, the method may include holding the biasing of the memory cell, during a third duration of the voltage pulse after the second duration, at the second voltage magnitude having the voltage polarity. The operations of 920 may be performed in accordance with examples as disclosed herein. In some examples, aspects of the operations of 920 may be performed by a biasing component 730 as described with reference to FIG. 7.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for determining to perform an imprint recovery procedure on one or more memory cells of a memory array; biasing a memory cell of the one or more memory cells, during a first duration of a voltage pulse, with a first voltage magnitude having a voltage polarity based at least in part on determining to perform the imprint recovery procedure; reducing the biasing of the memory cell, during a second duration of the voltage pulse after the first duration, from the first voltage magnitude to a second voltage magnitude having the voltage polarity; and holding the biasing of the memory cell, during a third duration of the voltage pulse after the second duration, at the second voltage magnitude having the voltage polarity.

Aspect 2: The method, apparatus, or non-transitory computer-readable medium of aspect 1 where the biasing of the memory cell is reduced during the second duration without falling below the second voltage magnitude between the first duration and the third duration.

Aspect 3: The method, apparatus, or non-transitory computer-readable medium of any of aspects 1 through 2 where the first voltage magnitude is associated with a polarization of a ferroelectric capacitor of the memory cell and the second voltage magnitude is associated with maintaining the polarization of the ferroelectric capacitor.

Aspect 4: The method, apparatus, or non-transitory computer-readable medium of any of aspects 1 through 3, further including operations, features, circuitry, logic, means, or instructions, or any combination thereof for identifying an indication of a severity of imprint of the one or more memory cells of the memory array and determining the second voltage magnitude based at least in part on the indication of the severity of imprint, where reducing the biasing of the memory cell during the second duration and holding the biasing of the memory cell during the third duration is based at least in part on the determined second voltage magnitude.

Aspect 5: The method, apparatus, or non-transitory computer-readable medium of aspect 4, further including operations, features, circuitry, logic, means, or instructions, or any combination thereof for determining a duration of storing logic states at the memory array, or a temperature associated with the memory array, or both, where identifying the indication of the severity of imprint is based at least in part on the duration of storing logic states, or the temperature, or both.

Aspect 6: The method, apparatus, or non-transitory computer-readable medium of any of aspects 1 through 5, further including operations, features, circuitry, logic, means, or instructions, or any combination thereof for receiving signaling from a host device, where determining to perform the imprint recovery procedure is based at least in part on the signaling from the host device.

Aspect 7: The method, apparatus, or non-transitory computer-readable medium of any of aspects 1 through 6, further including operations, features, circuitry, logic, means, or instructions, or any combination thereof for receiving signaling from the host device that indicates the second voltage magnitude, where reducing the biasing of the memory cell during the second duration and holding the biasing of the memory cell during the third duration is based at least in part on the indicated second voltage magnitude.

Aspect 8: The method, apparatus, or non-transitory computer-readable medium of any of aspects 1 through 7, further including operations, features, circuitry, logic, means, or instructions, or any combination thereof for biasing the memory cell, during a fourth duration of a second voltage pulse after the third duration, with the first voltage magnitude having a second voltage polarity based at least in part on determining to perform the imprint recovery procedure; reducing the biasing of the memory cell, during a fifth duration of the second voltage pulse after the fourth duration, from the first voltage magnitude to the second voltage magnitude having the second voltage polarity; and holding the biasing of the memory cell, during a sixth duration of the second voltage pulse after the fifth duration, at the second voltage magnitude having the second voltage polarity.

Aspect 9: The method, apparatus, or non-transitory computer-readable medium of any of aspects 1 through 8, further including operations, features, circuitry, logic, means, or instructions, or any combination thereof for biasing a second memory cell of the one or more memory cells, during a seventh duration of a third voltage pulse after the first duration, with the first voltage magnitude having the voltage polarity based at least in part on determining to perform the imprint recovery procedure; reducing the biasing of the second memory cell, during an eighth duration of the third voltage pulse after the seventh duration, from the first voltage magnitude to the second voltage magnitude having the voltage polarity; and holding the biasing of the second memory cell, during a ninth duration of the third voltage pulse after the eighth duration, at the second voltage magnitude having the voltage polarity.

Aspect 10: The method, apparatus, or non-transitory computer-readable medium of aspect 9 where the seventh duration is overlapping with the second duration, or the third duration, or both the second duration and the third duration.

Figure 10:
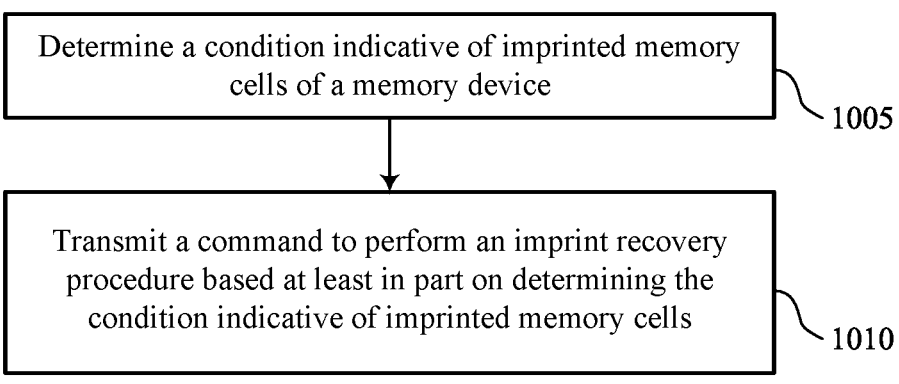

FIG. 10 shows a flowchart illustrating a method 1000 that supports switch and hold biasing for memory cell imprint recovery in accordance with examples as disclosed herein.

The operations of method 1000 may be implemented by a host device or its components as described herein. For example, the operations of method 1000 may be performed by a host device as described with reference to FIGS. 1 through 6 and 8. In some examples, a host device may execute a set of instructions to control the functional elements of the device to perform the described functions. Additionally, or alternatively, the host device may perform aspects of the described functions using special-purpose hardware.

At 1005, the method may include determining (e.g., at a host device) a condition indicative of imprinted memory cells of a memory device. The operations of 1005 may be performed in accordance with examples as disclosed herein. In some examples, aspects of the operations of 1005 may be performed by an imprint indicator component 825 as described with reference to FIG. 8.

At 1010, the method may include transmitting a command (e.g., to a memory device) to perform an imprint recovery procedure based at least in part on determining the condition indicative of imprinted memory cells. In some examples, the imprint recovery procedure may include biasing a memory cell of the memory device, during a first duration, with a first voltage magnitude in accordance with a voltage polarity, reducing the biasing of the memory cell, during a second duration after the first duration, from the first voltage magnitude to a second voltage magnitude in accordance with the voltage polarity, and holding the biasing of the memory cell, during a third duration after the second duration, at the second voltage magnitude in accordance with the voltage polarity. The operations of 1010 may be performed in accordance with examples as disclosed herein. In some examples, aspects of the operations of 1010 may be performed by a command transmitter component 830 as described with reference to FIG. 8.

In some examples, an apparatus as described herein may perform a method or methods, such as the method 1000. The apparatus may include features, circuitry, logic, means, or instructions (e.g., a non-transitory computer-readable medium storing instructions executable by a processor), or any combination thereof for performing the following aspects of the present disclosure:

Aspect 11: A method, apparatus, or non-transitory computer-readable medium including operations, features, circuitry, logic, means, or instructions, or any combination thereof for determining (e.g., at a host device) a condition indicative of imprinted memory cells of a memory device and transmitting a command to perform an imprint recovery procedure based at least in part on determining the condition indicative of imprinted memory cells, where the imprint recovery procedure includes biasing a memory cell of the memory device, during a first duration, with a first voltage magnitude in accordance with a voltage polarity, reducing the biasing of the memory cell, during a second duration after the first duration, from the first voltage magnitude to a second voltage magnitude in accordance with the voltage polarity, and holding the biasing of the memory cell, during a third duration after the second duration, at the second voltage magnitude in accordance with the voltage polarity.

Aspect 12: The method, apparatus, or non-transitory computer-readable medium of aspect 11 where the first voltage magnitude is associated with a polarization of a ferroelectric capacitor of the memory cell and the second voltage magnitude is configured to maintain the polarization of the ferroelectric capacitor.

Aspect 13: The method, apparatus, or non-transitory computer-readable medium of any of aspects 11 through 12, further including operations, features, circuitry, logic, means, or instructions, or any combination thereof for transmitting signaling that indicates the second voltage magnitude.

Aspect 14: The method, apparatus, or non-transitory computer-readable medium of any of aspects 11 through 13, further including operations, features, circuitry, logic, means, or instructions, or any combination thereof for identifying an indication of a severity of imprint and determining the second voltage magnitude based at least in part on the indication of the severity of imprint.

Aspect 15: The method, apparatus, or non-transitory computer-readable medium of aspect 14, further including operations, features, circuitry, logic, means, or instructions, or any combination thereof for detecting a duration of storing logic states at the memory device, or a temperature associated with the memory device, or both, where identifying the indication of the severity of imprint is based at least in part on the duration of storing logic states, or the temperature, or both.

It should be noted that the methods described herein are possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 16: An apparatus, including: a memory array including a plurality of memory cells; and circuitry coupled with the memory array and configured to cause the apparatus to: determine to perform an imprint recovery procedure on at least a portion of the memory array; bias a memory cell of the plurality, during a first duration of a voltage pulse, with a first voltage magnitude having a voltage polarity based at least in part on determining to perform the imprint recovery procedure; reduce the biasing of the memory cell, during a second duration of the voltage pulse after the first duration, from the first voltage magnitude to a second voltage magnitude having the voltage polarity; and hold the biasing of the memory cell, during a third duration of the voltage pulse after the second duration, at the second voltage magnitude having the voltage polarity.

Aspect 17: The apparatus of aspect 16, where the circuitry is configured to reduce the biasing of the memory cell during the second duration without falling below the second voltage magnitude between the first duration and the third duration.

Aspect 18: The apparatus of any of aspects 16 through 17, where: the first voltage magnitude is associated with a polarization of a ferroelectric capacitor of the memory cell; and the second voltage magnitude is associated with maintaining the polarization of the ferroelectric capacitor.

Aspect 19: The apparatus of any of aspects 16 through 18, where the circuitry is further configured to cause the apparatus to: identify an indication of a severity of imprint of the memory array; determine the second voltage magnitude based at least in part on the indication of the severity of imprint; and reduce the biasing of the memory cell during the second duration and hold the biasing of the memory cell during the third duration based at least in part on the determined second voltage magnitude.

Aspect 20: The apparatus of aspect 19, where the circuitry is further configured to cause the apparatus to: detect a duration of storing logic states at the memory array, or a temperature associated with the memory array, or both; and identify the indication of the severity of imprint based at least in part on the duration of storing logic states, or the temperature, or both.

Aspect 21: The apparatus of any of aspects 16 through 20, where the circuitry is further configured to cause the apparatus to: receive a command, where determining to perform the imprint recovery procedure is based at least in part on receiving the command.

Aspect 22: The apparatus of any of aspects 16 through 21, where the circuitry is further configured to cause the apparatus to: receive an indication of the second voltage magnitude; and reduce the biasing of the memory cell during the second duration and hold the biasing of the memory cell during the third duration based at least in part on the indicated second voltage magnitude.

Aspect 23: The apparatus of any of aspects 16 through 22, where the circuitry is further configured to cause the apparatus to: bias the memory cell, during a fourth duration of a second voltage pulse after the third duration, with the first voltage magnitude having a second voltage polarity based at least in part on determining to perform the imprint recovery procedure; reduce the biasing of the memory cell, during a fifth duration of the second voltage pulse after the fourth duration, from the first voltage magnitude to the second voltage magnitude having the second voltage polarity; and hold the biasing of the memory cell, during a sixth duration of the second voltage pulse after the fifth duration, at the second voltage magnitude having the second voltage polarity.

Aspect 24: The apparatus of any of aspects 16 through 23, where the circuitry is further configured to cause the apparatus to: bias a second memory cell of the plurality, during a seventh duration of a third voltage pulse after the first duration, with the first voltage magnitude having the voltage polarity based at least in part on determining to perform the imprint recovery procedure; reduce the biasing of the second memory cell, during an eighth duration of the third voltage pulse after the seventh duration, from the first voltage magnitude to the second voltage magnitude having the voltage polarity; and hold the biasing of the second memory cell, during a ninth duration of the third voltage pulse after the eighth duration, at the second voltage magnitude having the voltage polarity.

Aspect 25: The apparatus of aspect 24, where the seventh duration is overlapping with the second duration, or the third duration, or both the second duration and the third duration.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:
1. A memory device, comprising:
one or more memory arrays; and
circuitry coupled with the one or more memory arrays and configured to cause the memory device to:
apply a recovery pulse to a memory cell of the one or more memory arrays, wherein, to apply the recovery pulse, the circuitry is configured to cause the memory device to:
bias the memory cell, during a first duration of the recovery pulse, with a first voltage magnitude having a voltage polarity;
reduce the biasing of the memory cell, during a second duration of the recovery pulse after the first duration, between the first voltage magnitude and a second voltage magnitude having the voltage polarity; and
bias the memory cell, during a third duration of the recovery pulse after the second duration, with the second voltage magnitude having the voltage polarity.
2. The memory device of claim 1, wherein, to apply the recovery pulse, the circuitry is configured to cause the memory device to:
reduce the biasing of the memory cell during the second duration without falling below the second voltage magnitude between the first duration and the third duration.
3. The memory device of claim 1, wherein:
the first voltage magnitude is associated with a polarization of a ferroelectric capacitor of the memory cell; and
the second voltage magnitude is associated with maintaining the polarization of the ferroelectric capacitor.

4. The memory device of claim 1, wherein the circuitry is configured to cause the memory device to:

determine the second voltage magnitude based at least in part on an indication of imprint severity of the one or more memory arrays.

5. The memory device of claim 1, wherein the circuitry is configured to cause the memory device to:

determine the second voltage magnitude based at least in part on a duration of storing logic states at the one or more memory arrays, or a temperature associated with the one or more memory arrays, or both.

6. The memory device of claim 1, wherein the circuitry is configured to cause the memory device to:

apply the recovery pulse based at least in part on receiving a command from a host device.

7. The memory device of claim 1, wherein the circuitry is configured to cause the memory device to:

receive an indication of the second voltage magnitude from a host device; and apply the recovery pulse in accordance with the indication of the second voltage magnitude.

8. The memory device of claim 1, wherein the circuitry is configured to cause the memory device to:

apply a second recovery pulse to the memory cell, wherein, to apply the second recovery pulse, the circuitry is configured to cause the memory device to:

bias the memory cell, during a fourth duration of the second recovery pulse, with a third voltage magnitude having a second voltage polarity;

reduce the biasing of the memory cell, during a fifth duration of the second recovery pulse after the fourth duration, between the third voltage magnitude and a fourth voltage magnitude having the second voltage polarity; and bias the memory cell, during a sixth duration of the second recovery pulse after the fifth duration, with the fourth voltage magnitude having the second voltage polarity.

9. The memory device of claim 1, wherein the circuitry is configured to cause the memory device to:

apply a third recovery pulse to a second memory cell of the one or more memory arrays, wherein, to apply the third recovery pulse, the circuitry is configured to cause the memory device to:

bias the second memory cell, during a seventh duration of the third recovery pulse, with the first voltage magnitude having the voltage polarity;

reduce the biasing of the second memory cell, during an eighth duration of the third recovery pulse after the seventh duration, between the first voltage magnitude and the second voltage magnitude having the voltage polarity; and bias the second memory cell, during a ninth duration of the third recovery pulse after the eighth duration, with the second voltage magnitude having the voltage polarity.

10. The memory device of claim 9, wherein the seventh duration is overlapping with the second duration, or the third duration, or both the second duration and the third duration.

11. The memory device of claim 9, wherein the circuitry is configured to apply the recovery pulse and the third recovery pulse to the memory cell and the second memory cell in different sections of the at least one of the one or more memory arrays.

12. A host device, comprising:

processing circuitry operable to couple with one or more memory devices using one or more channels, the processing circuitry configured to cause the host device to:

transmit a command, to at least one of the one or more memory devices, to perform an imprint recovery procedure, wherein a recovery pulse of the imprint recovery procedure comprises:

a first bias, with a first voltage magnitude having a voltage polarity, to a memory cell of the at least one of the one or more memory devices during a first duration of the recovery pulse;

a bias reduction, between the first voltage magnitude and a second voltage magnitude having the voltage polarity, to the memory cell during a second duration of the recovery pulse after the first duration; and a second bias, with the second voltage magnitude having the voltage polarity, to the memory cell during a third duration of the recovery pulse after the second duration.

13. The host device of claim 12, wherein the recovery pulse of the imprint recovery procedure comprises:

the bias reduction between the first voltage magnitude and the second voltage magnitude without falling below the second voltage magnitude between the first duration and the third duration.

14. The host device of claim 12, wherein:

the first voltage magnitude is associated with a polarization of a ferroelectric capacitor of the memory cell; and the second voltage magnitude is configured to maintain the polarization of the ferroelectric capacitor.

15. The host device of claim 12, wherein the processing circuitry is configured to cause the host device to:

transmit an indication of the second voltage magnitude for the imprint recovery procedure.

16. The host device of claim 15, wherein the processing circuitry is configured to cause the host device to:

determine the second voltage magnitude based at least in part on a detected severity of imprint.

17. The host device of claim 15, wherein the processing circuitry is configured to cause the host device to:

determine the second voltage magnitude based at least in part on a duration of storing logic states at the one or more memory devices, or a temperature associated with the one or more memory devices, or both.

18. The host device of claim 12, wherein a second recovery pulse of the imprint recovery procedure comprises:

a third bias, with a third voltage magnitude having a second voltage polarity, to the memory cell during a fourth duration of the second recovery pulse;

a second bias reduction, between the third voltage magnitude and a fourth voltage magnitude having the second voltage polarity, to the memory cell during a fifth duration of the second recovery pulse after the fourth duration; and a fourth bias, with the fourth voltage magnitude having the second voltage polarity, to the memory cell during a sixth duration of the second recovery pulse after the fifth duration.

19. The host device of claim 12, wherein the processing circuitry is configured to cause the host device to:

detect an operating condition indicative of imprinted memory cells; and transmit the command to perform the imprint recovery procedure based at least in part on a detected operating condition.

20. A method at a memory device, comprising:

applying a recovery pulse to a memory cell of the memory device, wherein applying the recovery pulse comprises:

biasing the memory cell, during a first duration of the recovery pulse, with a first voltage magnitude having a voltage polarity;

reducing the biasing of the memory cell, during a second duration of the recovery pulse after the first duration, between the first voltage magnitude and a second voltage magnitude having the voltage polarity; and biasing the memory cell, during a third duration of the recovery pulse after the second duration, with the second voltage magnitude having the voltage polarity.

* * * * *